(12) United States Patent
Tisdale et al.

(10) Patent No.: US 12,304,919 B2
(45) Date of Patent: May 20, 2025

(54) METAL-ORGANIC CHALCOGENOLATES

(71) Applicant: Massachusetts Institute of Technology, Cambridge, MA (US)

(72) Inventors: William A. Tisdale, Belmont, MA (US); Watcharaphol Paritmongkol, Boston, MA (US); Tomoaki Sakurada, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 761 days.

(21) Appl. No.: 17/509,675

(22) Filed: Oct. 25, 2021

(65) Prior Publication Data
US 2023/0130671 A1     Apr. 27, 2023

(51) Int. Cl.
| | |
|---|---|
| *C07F 1/10* | (2006.01) |
| *C09K 11/88* | (2006.01) |
| *H10K 30/00* | (2023.01) |
| *H10K 85/30* | (2023.01) |
| *H10K 50/11* | (2023.01) |
| *H10K 101/10* | (2023.01) |

(52) U.S. Cl.
CPC .............. *C07F 1/10* (2013.01); *C09K 11/88* (2013.01); *H10K 30/451* (2023.02); *H10K 85/371* (2023.02); *H10K 50/11* (2023.02); *H10K 2101/10* (2023.02)

(58) Field of Classification Search
CPC .... C07F 1/10; H10K 2101/10; H10K 85/371; H10K 30/451; H10K 50/11
See application file for complete search history.

(56) References Cited

FOREIGN PATENT DOCUMENTS

| | | | | | |
|---|---|---|---|---|---|
| JP | 2003252612 A | * | 9/2003 | ............. | C01B 19/02 |
| WO | 2018038898 A3 | | 3/2018 | | |

OTHER PUBLICATIONS

Clarivate Analytics machine translation JP 2003252612 A. published Sep. 10, 2003 (Year: 2003).*
Pop et al. J. Organomet. Chem., 768, 2014, 121-127. published online Jul. 1, 2014 (Year: 2014).*
Ahn et al. "Prevention of transition metal dichalcogenide photodegradation by encapsulation with h-BN layers." ACS nano 10.9 (2016): 8973-8979.
Bashir et al. "Selenium as a Key Element for Highly Ordered Aromatic Self-Assembled Monolayers." Angewandte Chemie International Edition 47.28 (2008): 5250-5252.
Bentley et al. "A new one-step synthesis of sulphenamides from alkyl and aryl disulphides." Journal of the Chemical Society D: Chemical Communications 24 (1971): 1625-1626.
Bonasia et al. "Synthesis and characterization of copper (I) and silver (I) tellurolates and selenolates. The X-ray crystal structures of {Cu [SeC (SiMe3) 3] PCy3} 2 and the homoleptic silver selenolate Ag4 [SeC (SiMe3) 3] 4." Inorganic Chemistry 33.9 (1994): 1797-1802.
Bryks et al. "Metallomesogen templates for shape control of metal selenide nanocrystals." Chemistry of Materials 29.8 (2017): 3653-3662.
Chaves et al. "Bandgap engineering of two-dimensional semiconductor materials." npj 2D Materials and Applications 4.1 (2020): 1-21.
Chen et al. "A series of polynuclear complexes of d10 metals with interesting luminescent properties." Crystal growth & design 10.3 (2010): 1155-1160.
Chernikov et al. "Exciton binding energy and nonhydrogenic Rydberg series in monolayer WS 2." Physical review letters 113.7 (2014): 076802, 5 pages.
Craine et al. "The chemistry of sulfenamides." Chemical Reviews 89.4 (1989): 689-712.
Cuthbert et al. "Synthesis and Structural Characterization of [Cu20Se4 (μ3-SePh) 12 (PPh3) 6] and [Ag (SePh)]∞." Zeitschrift für anorganische und allgemeine Chemie 628.11 (2002): 2483-2488.
Dasna et al. "Ferromagnetic interactions in Mn (II) coordination complex containing nitronyl nitroxide radical and silver-dicyanide anion: structure and magnetic studies of MnII (NITpPy) 2 [Ag (CN) 2] 2." Polyhedron 20.11-14 (2001): 1371-1374.
Davis et al. "Chemistry of the sulfur-nitrogen bond. 12. Metal-assisted synthesis of sulfenamide derivatives from aliphatic and aromatic disulfides." The Journal of Organic Chemistry 42.6 (1977): 967-972.
Fu et al. "Effect of dielectric environment on excitonic dynamics in monolayer WS2." Advanced Materials Interfaces 6.23 (2019): 1901307, 9 pages.
Goodman et al. "Substrate-dependent exciton diffusion and annihilation in chemically treated MoS2 and WS2." The Journal of Physical Chemistry C 124.22 (2020): 12175-12184.
Han et al. "Ultrastable atomically precise chiral silver clusters with more than 95% quantum efficiency." Science advances 6.6 (2020): eaay0107, 8 pages.
He et al. "Tightly bound excitons in monolayer WSe 2." Physical review letters 113.2 (2014): 026803, 5 pages.
Hong et al. "Controlled assembly based on multibridging thiolate ligands: new polymeric silver (I) complexes with one-dimensional chain and three-dimensional network structures." Inorganic chemistry 38.3 (1999): 600-602.
Hu et al. "Synthesis and Characterization of Single-Layer Silver-Decanethiolate Lamellar Crystals." Journal of the American Chemical Society 133.12 (2011): 4367-4376.
Huang et al. "Single-component mlct-active photodetecting material based on a two-dimensional coordination polymer." CCS Chemistry 2.1 (2020): 655-662.

(Continued)

*Primary Examiner* — Jane L Stanley
(74) *Attorney, Agent, or Firm* — Smith Baluch LLP

(57) ABSTRACT

A metal-organic chalcogenolate (MOC) includes silver phenylselenolate functionalized with at least one functional group. The functional group may be methyl ($CH_3$), dimethylamine ($N(CH_3)_2$), thiomethyl ($SCH_3$), fluoro (F) trifluoromethyl ($CF_3$), cyanide (CN), carboxy (COOH), nitrito ($NO_2$), or alkoxy ($OC_xH_y$). The MOC can be in the form of a single crystal consisting essentially of a nanocluster (0D), a nanotube (1D), or a single monolayer (2D).

5 Claims, 41 Drawing Sheets

(56) References Cited

OTHER PUBLICATIONS

Illyés et al. "Novel approaches to the syntheses of N-substituted S-glycosyl-sulfenamides." Carbohydrate research 339.8 (2004): 1561-1564.
Iqbal et al. "High-mobility and air-stable single-layer WS2 field-effect transistors sandwiched between chemical vapor deposition-grown hexagonal BN films." Scientific reports 5.1 (2015): 1-9.
Jardim et al. "Copper complexes and carbon nanotube-copper ferrite-catalyzed benzenoid A-ring selenation of quinones: an efficient method for the synthesis of trypanocidal agents." New Journal of Chemistry 43.35 (2019): 13751-13763.
Jeong et al. "Integrated Freestanding Two-dimensional Transition Metal Dichalcogenides." Advanced Materials 29.18 (2017): 1700308, 9 pages.
Kastl et al. "Exciton self-trapping causes picoseconds recombination in metal-organic chalcogenides hybrid quantum wells." arXiv preprint arXiv:2103.06390 (2021), 21 pages.
Lavenn et al. "Shedding light on an ultra-bright photoluminescent lamellar gold thiolate coordination polymer [Au (p-SPhCO 2 Me)]n." Chemical Communications 52.58 (2016): 9063-9066.
Li et al. "Coordination assembly of 2D ordered organic metal chalcogenides with widely tunable electronic band gaps." Nature communications 11.1 (2020): 1-9.
Liang et al. "Van der Waals heterostructures for high-performance device applications: challenges and opportunities." Advanced Materials 32.27 (2020): 1903800. 1-27.
Lim et al. "An efficient and practical method for the selective synthesis of sodium diselenide and diorganyl diselenides through selenium reduction." Tetrahedron 76.52 (2020): 131720, 9 pages.
Low et al. "Highly conducting two-dimensional copper (I) 4-hydroxythiophenolate network." Chemical communications 46.39 (2010): 7328-7330.
Mak et al. "Tightly bound trions in monolayer MoS2." Nature materials 12.3 (2013): 207-211.
Maserati et al. "Anisotropic 2D excitons unveiled in organic-inorganic quantum wells." Materials horizons 8.1 (2021): 197-208.
Maserati et al. "Photo-electrical properties of 2D quantum confined metal-organic chalcogenide nanocrystal films." Nanoscale 13.1 (2021): 233-241.
Maserati et al. "Understanding the Synthetic Pathway to Large-Area, High-Quality [AgSePh]∞ Nanocrystal Films." The Journal of Physical Chemistry C 124.41 (2020): 22845-22852.
Mitchell et al. "Rapid additive-free selenocystine-selenoester peptide ligation." Journal of the American Chemical Society 137.44 (2015): 14011-14014.
Mueller et al. "Exciton physics and device application of two-dimensional transition metal dichalcogenide semiconductors." npj 2D Materials and Applications 2.1 (2018): 1-12.
Novoselov et al. "2D materials and van der Waals heterostructures." Science 353.6298 (2016): aac9439, 13 pages.
Paritmongkol—PHD Thesis; Syntheses and Photophysical Studies of Two-Dimensional Hybrid Organic-Inorganic Semi Conductors, Sep. 2021, 185 pages.
Paritmongkol et al. "Morphological Control of 2D Hybrid Organic-Inorganic Semiconductor AgSePh." ACS nano 16.2 (2022): 2054-2065.
Paritmongkol et al. "Size and quality enhancement of 2D semiconducting metal-organic chalcogenolates by amine addition." Journal of the American Chemical Society 143.48 (2021): 20256-20263.
Paritmongkol, Synthesis of Blue-Emitting 2D Silver Phenylselenolate in Thin Film and Crystal Forms, NanoGe Fall Meeting, Oct. 22, 2020, 12 pages.
Paritmongkol, Synthesis of Blue-Emitting 2D Silver Phenylselenolate in Thin Film and Crystal Forms, Nov. 27-Dec. 4, 2020, MRS_Fall_2020_Presentation, 13 pages.
Paritmongkol, Tunable Morphology and Electronic Properties of Hybrid Organic-Inorganic 2D Semiconducting AgSePh, Mar. 8-12, 2021, Spring_2021_Presentation, 10 pages.
Park et al. "Controlled growth of calcium carbonate by poly (ethylenimine) at the air/water interface." Chemical Communications 1 (2004): 24-25.
Paulmier et al. "N, N-Diethylbenzeneselenenamide." Encyclopedia of Reagents for Organic Synthesis (2001): 1-3.
Paulmier et al. P. 1H, 13C, 15N, 17O and 77Se NMR of Selenenamides. Magn. Reson. Chem. 1987, 25 (11), 955-959.
Popple et al. "Competing Roles of Crystallization and Degradation of a Metal-Organic Chalcogenolate Assembly under Biphasic Solvothermal Conditions." Langmuir 34.47 (2018): 14265-14273.
Qiu et al. "Optical spectrum of MoS 2: many-body effects and diversity of exciton states." Physical review letters 111.21 (2013): 216805, 5 pages.
Sabin et al. "Photophysical properties of hexanuclear copper (I) and silver (I) clusters." Inorganic Chemistry 31.10 (1992): 1941-1945.
Schmidbaur et al."Argentophilic interactions." Angewandte Chemie International Edition 54.3 (2015): 746-784.
Schriber et al. "Mithrene is a self-assembling robustly blue luminescent metal-organic chalcogenolate assembly for 2D optoelectronic applications." ACS Applied Nano Materials 1.7 (2018): 3498-3508.
Sousa-Pedrares et al. "Synthesis and characterization of copper (I) and silver (I) complexes with heterocyclic bidentate ligands (N, X), X=S, Se." Inorganica Chimica Acta 363.6 (2010): 1212-1221.
Su et al. "A Semiconducting Lamella Polymer [{Ag (C5H4NS)} n] with a Graphite-Like Array of Silver (i) Ions and Its Analogue with a Layered Structure." Angewandte Chemie International Edition 39.16 (2000): 2911-2914.
Su et al. "Tunable polymerization of silver complexes with organosulfur ligand: counterions effect, solvent-and temperature-dependence in the formation of silver (I)-thiolate (and/or thione) complexes." Inorganica chimica acta 331.1 (2002): 8-15.
Tang et al. "Synthesis, crystal structure and optical limiting property of a novel octanuclear silver cluster complex with an aryl selenolate ligand." Journal of the Chemical Society, Dalton Transactions 8 (2001): 1374-1377.
Trang et al. "Tarnishing silver metal into mithrene." Journal of the American Chemical Society 140.42 (2018): 13892-13903.
Ugeda et al. "Giant bandgap renormalization and excitonic effects in a monolayer transition metal dichalcogenide semiconductor." Nature materials 13.12 (2014): 1091-1095.
Veselska et al. "An intrinsic dual-emitting gold thiolate coordination polymer, [Au (+ I)(p-SPhCO 2 H)] n, for ratiometric temperature sensing." Journal of Materials Chemistry C 5.38 (2017): 9843-9848.
Veselska et al. "d10 coinage metal organic chalcogenolates: From oligomers to coordination polymers." Coordination Chemistry Reviews 355 (2018): 240-270.
Veselska et al. "Intrinsic triple-emitting 2D copper thiolate coordination polymer as a ratiometric thermometer working over 400 K range." Chemical Communications 53.90 (2017): 12225-12228.
Veselska et al. "Structural diversity of coordination polymers based on a heterotopic ligand: Cu (II)-Carboxylate vs Cu (I)-Thiolate." Inorganic Chemistry 57.5 (2018): 2736-2743.
Wang et al. "Ag (I)-thiolate coordination polymers: Synthesis, structures and applications as emerging sensory ensembles." Coordination Chemistry Reviews 432 (2021): 213717 (18 pages).
Wu et al. "A novel hexanuclear silver (I) complex with photoluminescence properties." Polyhedron 122 (2017): 155-160.
Wu et al. "Multiscale Assembly of [AgS4] Tetrahedrons into Hierarchical Ag-S Networks for Robust Photonic Water." Advanced Materials 33.8 (2021): 2006459., 8 pages.
Yao et al. "Strongly quantum-confined blue-emitting excitons in chemically configurable multiquantum wells." ACS nano 15.3 (2020): 4085-4092.
Yue et al. "A polynuclear d10—d10 metal complex with unusual near-infrared luminescence and high thermal stability." Inorganic chemistry 48.7 (2009): 2873-2879.

* cited by examiner

2D

1D

OD

1230

| Example | n | $X_1$ | $X_2$ | $X_3$ | $X_4$ | Y | R | Emission peak (nm) | Possible structure |
|---|---|---|---|---|---|---|---|---|---|
| 1 | 1 | H | H | H | H | C | H | 467 | 2D |
| 2 | 1 | H | H | H | H | C | $N(CH_3)_2$ | 489 | 2D |
| 3 | 1 | H | H | H | H | C | $SCH_3$ | 483 | 2D |
| 4 | 1 | H | H | H | H | C | $OC_8H_{17}$ | 477 | 2D |
| 5 | 1 | H | H | H | H | C | $CH_3$ | 468 | 2D |
| 6 | 1 | H | H | H | H | C | F | 473 | 2D |
| 7 | 1 | H | H | H | H | C | $CF_3$ | 461 | 2D |
| 8 | 1 | H | H | H | H | C | COOH | 452 | 2D |
| 9 | 1 | H | H | H | H | N | H | 628 | 1D |
| 10 | 2 | H | H | H | H | C | H | 700 | 2D |
| 11 | 1 | F | F | H | H | C | H | 464 | 2D |
| 12 | 1 | F | F | H | H | C | H | 480 | 2D |
| 13 | 1 | F | H | H | H | C | F | 479 | 2D |
| 14 | 1 | F | H | H | F | C | H | 560 | 1D |

METAL-ORGANIC CHALCOGENOLATES

GOVERNMENT SUPPORT

This invention was made with government support under W911NF-20-1-0200 awarded by the U.S. Army Research Office. The government has certain rights in the invention.

BACKGROUND

A chalcogenide is a chemical compound that includes at least one chalcogen anion and at least one electropositive element. Chalcogen anions conventionally include sulfides, selenides, tellurides, and polonides. Transition metal chalcogenides occur with many stoichiometries and many structures. Many transition metal chalcogenides occur with a stoichiometry of 1:1, known as monochalcogenides with the formula ME, where M is a transition metal and E is S, Se, or Te. Another common stoichiometry is 1:2, known as dichalcogenides with the formula $ME_2$. Monochalcogenides and dichalcogenides are promising semiconductors that may be useful in a variety of emerging applications, including optoelectronics, field effect transistors, and photovoltaic cells.

SUMMARY

Related to transition metal chalcogenides, metal-organic chalcogenolates (MOCs) are chemical compounds that include at least one chalcogen anion, at least one metal, and at least one organic ligand. MOCs are covalently bound hybrid organic-inorganic materials with a $[M(ER)]_n$ chemical formula, where M is a metal, E is a chalcogen, and R is an organic hydrocarbon. Often, M is a coinage-type metal, including at least one of copper, silver, or gold. These metals are non-toxic. Often, E is at least one of sulfur, selenium, or tellurium.

MOCs occur in several different forms. These forms include self-assembled monolayers (SAMs), functionalized nanoparticles and clusters, and molecular complexes and coordination polymers. These forms occur as zero-dimensional (0D), one-dimensional (1D), two-dimensional (2D), and three-dimensional (3D) structures. In 0D structures, all dimensions are measured within the nanoscale (less than 100 nm) (e.g., nanoparticles, nanoclusters, and molecular complexes). In 1D structures, one dimension is outside the nanoscale (e.g., nanotubes). In 2D structures, two dimensions fall outside of the nanoscale (e.g., single-layer or few-layer materials). In 3D structures, all three dimensions fall outside of the nanoscale. MOCs are distinguished by strong covalent interactions between inorganic and organic components. Because of their covalent interactions, MOCs are stable in both polar and non-polar solvents.

MOCs with thiolate ligands have potential pharmaceutical uses and catalytic activity. As an example of pharmaceutical use, gold thiolate MOCs with thiolate ligands are used as drugs for arthritis therapy. As an example of catalytic activity, MOCs with thiolate ligands are used as intermediates in the synthesis of functionalized nanoparticles and clusters.

In comparison, MOCs with thiolate ligands have not been widely studied for their luminescent and optoelectronic properties. Most MOCs with thiolate ligands do not show luminescence at room temperature. At room temperature, almost all 2D MOCs with thiolate ligands are not emissive. Without being bound by any theory, the non-emissive nature of these thiolate MOCs may be a result of trap states in the material that provide non-emissive energy relaxation pathways from the excited state to the ground state. These materials may also include strong exciton-phonon coupling that facilitates non-emissive relaxation pathways. The emissive relaxation pathway may also be forbidden by symmetry.

Here, MOCs with selenium showed surprisingly robust luminescence at room temperature. In addition to the covalent interactions between organic ligands and selenium anions, these MOCs also have strong interactions between the silver and selenium anions. Because of these strong interactions, electronic states in MOCs can hybridize into the organic ligands, forming hybrid organic-inorganic semiconductors. The hybrid nature of MOCs provides several useful properties, which are discussed in greater detail below.

Because of their hybrid nature, these selenium-based MOCs have optoelectronic properties that can be modified by modifying the organic ligand. For example, the organic ligand can be modified with organic functional groups to tune the electronic bandgap of the MOC. As another example, using a heterocycle in the organic ligand changes the morphology of the MOC crystals. As another example, using larger fused aromatic rings in the organic ligand increases photoluminescent lifetime. These capabilities are not typically seen in other semiconductors. Tuning the electronic bandgap and/or crystal morphology in turn tunes the luminescent and optoelectronic properties of the MOC.

Furthermore, an improved method of synthesizing MOCs is disclosed herein. Conventional methods of fabricating MOCs typically result in small MOC microcrystals with dimensions smaller than 5 micrometers (μm). The small size of these microcrystals precludes some types of analysis. Furthermore, the small size of the microcrystals presents several challenges to integrating MOCs into devices. These smaller microcrystals also typically have limited optoelectronic performance, possibly due to mid-gap states present in their electrical signatures and increased numbers of grain boundaries. As described herein, an improved synthesis method creates MOC crystals with improved optoelectronic performance and sizes ranging from smaller than 5 μm to larger than 1 millimeter (mm).

As described herein, MOC optoelectronic performance can be modified by modifying the organic ligand in the MOC. Organic ligands with functional groups can be used to tune the electronic bandgap of the MOC. Organic ligands with heterocycles can change the morphology of the MOC crystal. Organic ligands with larger fused aromatic rings can increase photoluminescent lifetime. These capabilities are not easily achieved in other semiconductors. Improved MOC synthesis methods using amine-assistance can produce MOCs with high crystalline quality and large crystal size.

In one embodiment, a MOC includes silver phenylselenolate functionalized with at least one functional group. The functional group may be a halogen, alkyl (R), alkylamine (NHR, NRR'), sulfanyl (SR), carboxy (COOH), cyanide (CN), nitro ($NO_2$), fluoroalkyl ($C_nF_{2n+1}$) where n is about 1 to about 10, or alkoxy (OR) where R and R' are organic hydrocarbons For example, the functional group may be fluorine (F), methyl ($CH_3$), dimethylamine ($N(CH_3)_2$), thiomethyl ($SCH_3$), trifluoromethyl ($CF_3$), carboxy (COOH), or alkoxy ($OC_xH_y$) where x is about 2 to about 30 The MOC can be in the form of a single crystal having at least one side with a dimension of about 1 μm to about 5 mm. The single crystal can have a thickness of about 1 monolayer (e.g., about 1 nm to about 5 nm) to about 1 mm (e.g., about 1 nm, about 10 nm, about 100 nm, about 1 μm, about 5 μm, about 10 µm, about 100 µm, or about 1 mm). In some cases, the single crystal can be in the form of a single monolayer or a few layer structure (e.g., about 2 layers to about 20 layers). These 2D structures are useful in many applications, including atomically thin electronics, wearable electronics, and flexible electronics. In other cases, the single crystal has a thickness of about 100 µm to about 1 mm, comprising millions of layers (which may be exfoliated to form single monolayer or few layer structures). These thicker structures are useful for characterization studies and applications where monolayer or few layer materials are not necessary, including solar cell absorbers and LED emissive materials.

In another embodiment, a manufacturing method includes selecting a starting material that includes at least one functional group; mixing a mixture including a solvent, an amine, the starting material, and a silver salt; and forming a silver phenylselenolate functionalized with the functional group. The starting material may include a functionalized diphenyl diselenide. The functional group may include an electron withdrawing group, including at least one of fluorine (F), trifluoromethyl ($CF_3$), carboxy (COOH), nitrile (CN), or nitro ($NO_2$), or an electron donating group, including at least one of methyl ($CH_3$), thiomethyl ($SCH_3$), or alkoxy ($OC_xH_y$). The amine may include at least one of ammonia ($NH_3$), methylamine ($CH_3NH_2$), ethylamine ($CH_3CH_2NH_2$), propylamine ($CH_3CH_2CH_2NH_2$), butylamine ($CH_3CH_2CH_2CH_2NH_2$), pentylamine ($CH_3CH_2CH_2CH_2CH_2NH_2$), or hexylamine ($CH_3CH_2CH_2CH_2CH_2CH_2NH_2$). The silver salt may include silver nitrate ($AgNO_3$), silver chloride (AgCl), silver sulfate ($Ag_2SO_4$), silver tetrafluoroborate ($AgBF_4$), and/or silver triflate (AgOTf).

In a further embodiment, a MOC includes a plurality of silver pyridylselenolate (AgSePy) clusters. Each silver atom in the plurality of AgSePy clusters is coordinated by two selenium atoms and one nitrogen atom. The plurality of AgSePy clusters form a 1D network and have a luminescent light emission in an orange region of a visible spectrum of light.

In a further embodiment, a MOC includes silver arylselenolate (AgSeAryl). An aryl group in the silver arylselenolate includes about 2 to about 5 fused aromatic rings. The silver arylselenolate has a luminescent light emission in a yellow region of a visible spectrum of light. The aryl group may be anthracene or naphthalene. The MOC may be in the form of a single crystal.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally and/or structurally similar elements).

DETAILED DESCRIPTION

Figure 1:
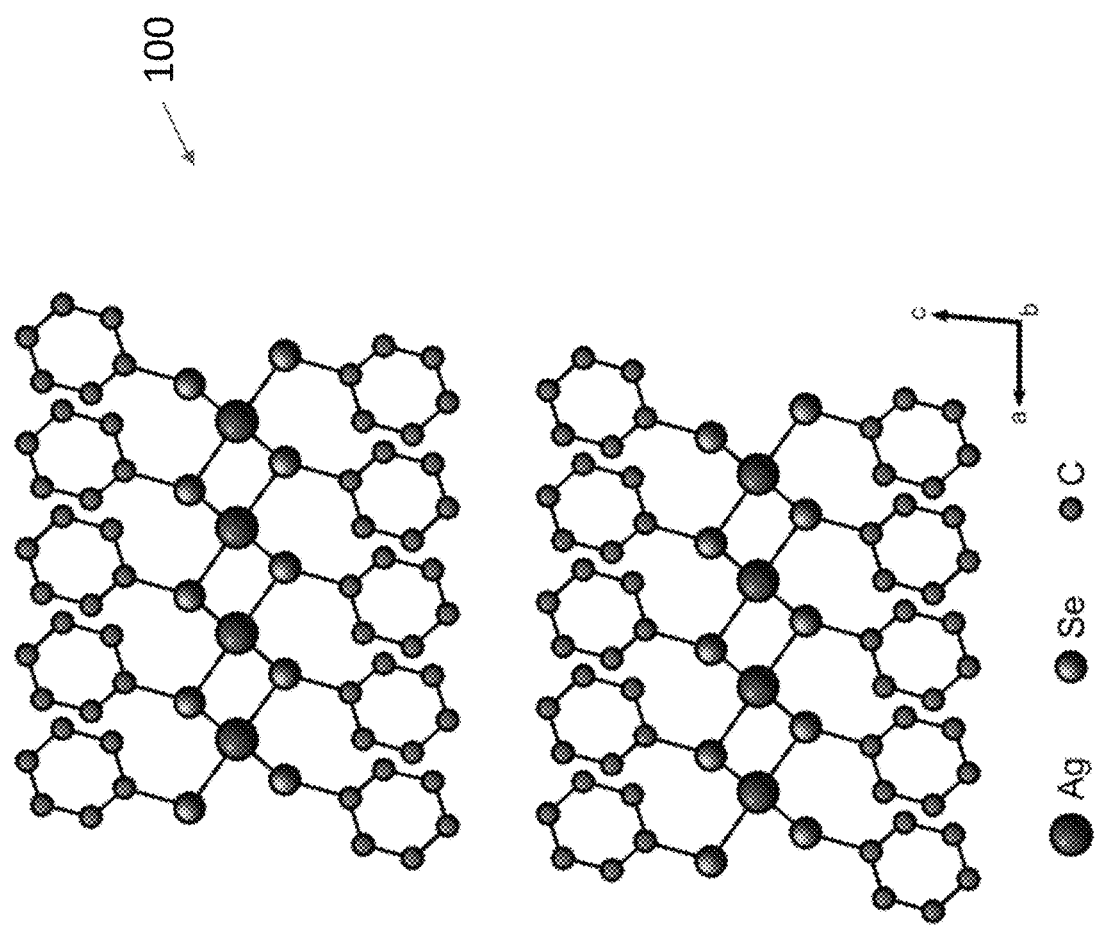
FIG. 1 shows the layered 2D structure of silver phenylselenolate (AgSePh).

A class of MOCs has the chemical formula $[Ag(SeR)]_n$, where R is an organic hydrocarbon. This class of materials has surprisingly robust light emission when illuminated at room temperature by light in the range of 200 nm to about 600 nm (e.g., 240 nm, 255 nm, 265 nm, 275 nm, 280 nm, 310 nm, 365 nm, 380 nm, 400 nm, 405 nm, 460 nm, 500 nm, 550 nm, or 600 nm). This class of MOCs has a variable photoluminescent emission with a peak emission in the range of about 400 nm to about 800 nm (e.g., 460 nm, 467 nm, 486 nm, 530 nm, or 628 nm). For example, silver phenylselenolate derivatives had photoluminescent emission between about 440 nm to about 520 nm. This class of MOCs is chemically and photochemically robust, tolerating exposure to oxygen and moisture to an extent that greatly surpasses rival excitonic materials such as transition metal dichalcogenides, perovskites, and organic semiconductors.

As described in more detail below, solution-phase methods of synthesizing this class of MOCs produces MOC single crystals with at least one side with a dimension of about 1 μm to about 5 mm (e.g., about 1 μm, about 5 μm, about 10 μm, about 20 μm, about 50 μm, about 100 μm, about 200 μm, about 500 μm, about 1 mm, or about 5 mm). As described in more detail below, the crystal structure of single-crystalline MOC structures were confirmed with single-crystal X-ray diffraction (SC-XRD). MOC single crystals produced using solution-phase methods were exfoliated to create substantially monolayer or few layer MOC single crystals. Few layer MOC single crystals may include about 2 to about 20 layers (e.g., about 2 layers, about 3 layers, about 4 layers, about 5 layers, or about 10 layers). Alternatively, a vapor-phase synthesis method produces MOC thin films that are monolayers or few layers.

The structural, morphological, electrical, and optoelectronic properties of $[Ag(SeR)]n$ may be changed by changing the R group. In one approach, the R group is at least one of an alkyl group (e.g., linear and/or branched $C_xH_y$, where x about 1 to about 30) or an aryl group (e.g., phenyl and its derivatives). In another approach, different R groups include different numbers of carbon atoms, different bonding, and different configurations. For example, an R group may be an alkyl chain with about 1 to about 30 carbon atoms. As another example, the R group may include one or more double bonds. As another example, the R group may include branching configurations. As another example, the R group may include an alkyl ring (e.g., cyclopropane). As another example, different R groups may include aryl rings of different sizes (e.g., phenyl or napthyl). As another example, different R groups may include more than one aryl ring and may include different connections between aryl rings (e.g., fused rings like naphthalene or anthracene, biaryl structures, or rings connected by alkyl chains). In another approach, the R group may be modified by adding functional groups to any of the R groups described above. Examples of functional groups include F, Cl, Br, OH, OR', COOH, COOR', $NO_2$, $NH_2$, NHR', NR'R", COH, COR', COCl, $SO_2H$, and $SO_2R'$, where R is $C_xH_y$, where x is about 1 to about 30. Another approach is to include heteroatoms in the R group. For example, the R group may be an aryl ring with one or two heteroatoms. Heteroatoms include O, S, Se, Te, N, P, As, B, and Al. The heteroatom may be in an ortho, para, or meta position in the aryl ring. In another approach, the R group includes any combination of any of the above-described approaches.

Silver phenylselenolate (AgSePh) is a 2D member of the broader class of MOC coordination polymers. AgSePh is a hybrid organic-inorganic 2D semiconductor. AgSePh has many promising properties, including blue luminescence, strong exciton binding energy, chemical robustness, and non-toxic elemental composition. AgSePh is a direct bandgap semiconductor regardless of the number of layers of AgSePh. This arises because of the presence of organic components that decouple the interactions between layers. Like most 2D materials, the transition dipole moment of AgSePh lies in the plane. Unlike many 2D materials, AgSePh also has in-plane anisotropy. Because the structure of AgSePh is anisotropic within the plane, the excitonic emission also shows an in-plane anisotropy. Because of this in-plane anisotropy, AgSePh can be used as a polarized emitter and/or a polarized detector. Overall, these features are attractive for many applications, including light-emitting applications, light-absorbing applications, and light-matter coupling applications.

FIG. 1 shows the chemical structure of AgSePh 100. AgSePh 100 crystallizes in the form of a 2D semiconductor containing stacks of 2D sheets bound together by interlayer van der Waals interactions. Each 2D sheet contains a layer of $Ag^+$ ions arranged in a distorted hexagonal pattern and sandwiched between two layers of phenylselenolate anions ($PhSe^-$), with mostly covalent character in the Ag—Se bond. Because of its covalent bonding and polymeric structure, AgSePh 100 is stable in polar solvents, including water, as well as in many non-polar solvents.

Figure 2:
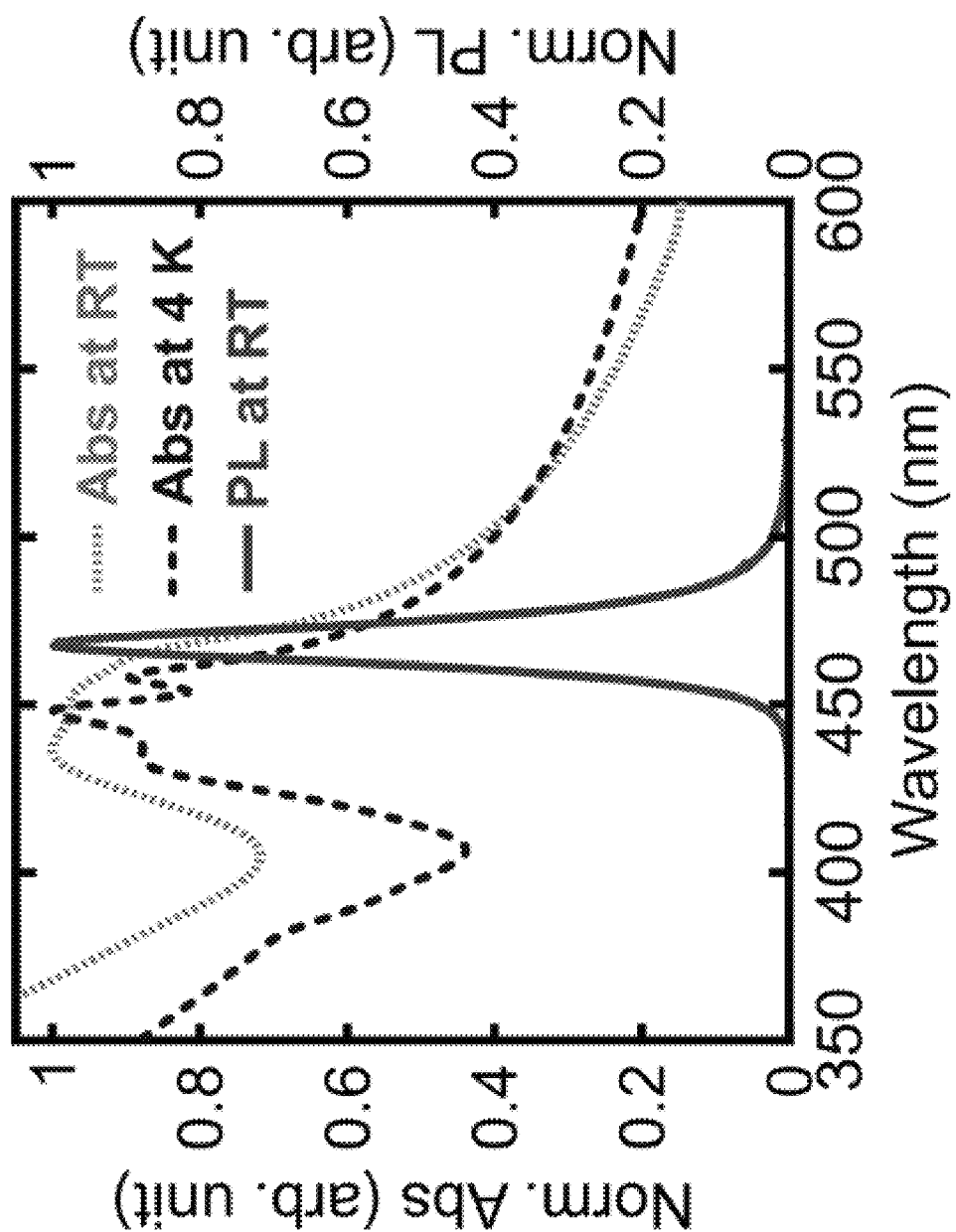
FIG. 2 shows the optical properties of AgSePh.

FIG. 2 shows the optical properties of AgSePh. AgSePh exhibits a narrow blue emission. Under room temperature photo-excitation by a 405 nm laser diode, a AgSePh film emitted light centered around 467 nm, with a narrow full-width-at-half-maximum of 14 nm and emitted substantially no light at about 500 nm to about 700 nm (See FIG. 20). To compare, conventional methods to synthesize AgSePh have resulted in AgSePh with emission spectra with wider full-width-half-maximum at 467 nm. The spectra of conventional AgSePh also included broad luminescent features at about 500 nm to about 700 nm. Without being bound by any theory, these features suggest that conventional AgSePh may include mid-gap luminescent states and/or crystal defects, and that these mid-gap states and crystal defects are substantially reduced or absent in the AgSePh disclosed herein. Here, the narrow emission peak of AgSePh (preferably having a full-width-at-half-maximum of about 5 nm to about 20 nm) may provide benefits for certain light-emitting applications, as described below. The absorption spectrum of the AgSePh film showed two resolved excitonic peaks centered at 436 nm and 453 nm. A second photo-excitation spectrum was measured at 4 K to minimize linewidth broadening from phonons. At 4 K, a second resolvable peak was present at 458 nm in the absorption spectrum, and the two peaks present at room temperature shifted to 435 nm and 448 nm. Without being bound by any particular theory, these observations suggest that there are multiple stable excitonic states in AgSePh that possibly originate from in-plane anisotropy.

Bandgap Tuning of 2D MOCs

The bandgap of $[Ag(SeR)]_n$ may be changed by changing the R group. As described above, the R group can be an alkyl or aryl group with about 1 to about 30 carbon atoms. In some cases, the R group includes single bonds, double bonds, triple bonds, or a combination of single, double, or triple bonds. In some cases, the R group includes a linear chain, a branched chain, a ring, or a combination of both linear and branched chains and/or a ring. In some cases, where the R group includes an aryl group, the aryl group includes a single ring or multiple rings. In some cases, the R group includes a combination of any of the R groups described above. Furthermore, any of the R groups may be modified by adding functional groups to any of the R groups described above. Examples of functional groups include F, Cl, Br, OH, OR', COOH, COOR', $NO_2$, $NH_2$, NHR', NR'R", COH, COR', COCl, $SO_2R'$, and $SO_3H$, where R' is $C_xH_y$, where x is about 1 to about 30. Functionalizing the R group can be used to change the emission spectrum of $[Ag(SeR)]_n$.

R group functionalization may also determine the structural dimensions of the MOC. The structural dimensions may be zero-dimensional (0D), one-dimensional (1D), two-dimensional (2D), or three-dimensional (3D) structures. Bulkier R groups tend to favor lower structural dimensions due to the steric effect. The structural dimensions may also have a relationship with the linewidth of the photoluminescent emission peak. 2D MOCs may have narrow (e.g., about 5 nm to about 40 nm, more specifically about 14 nm to about 22 nm) linewidth photoluminescent emission. 0D and 1D MOCs may have broad (e.g., about 50 nm to about 200 nm) linewidth photoluminescent emission.

Figure 3:
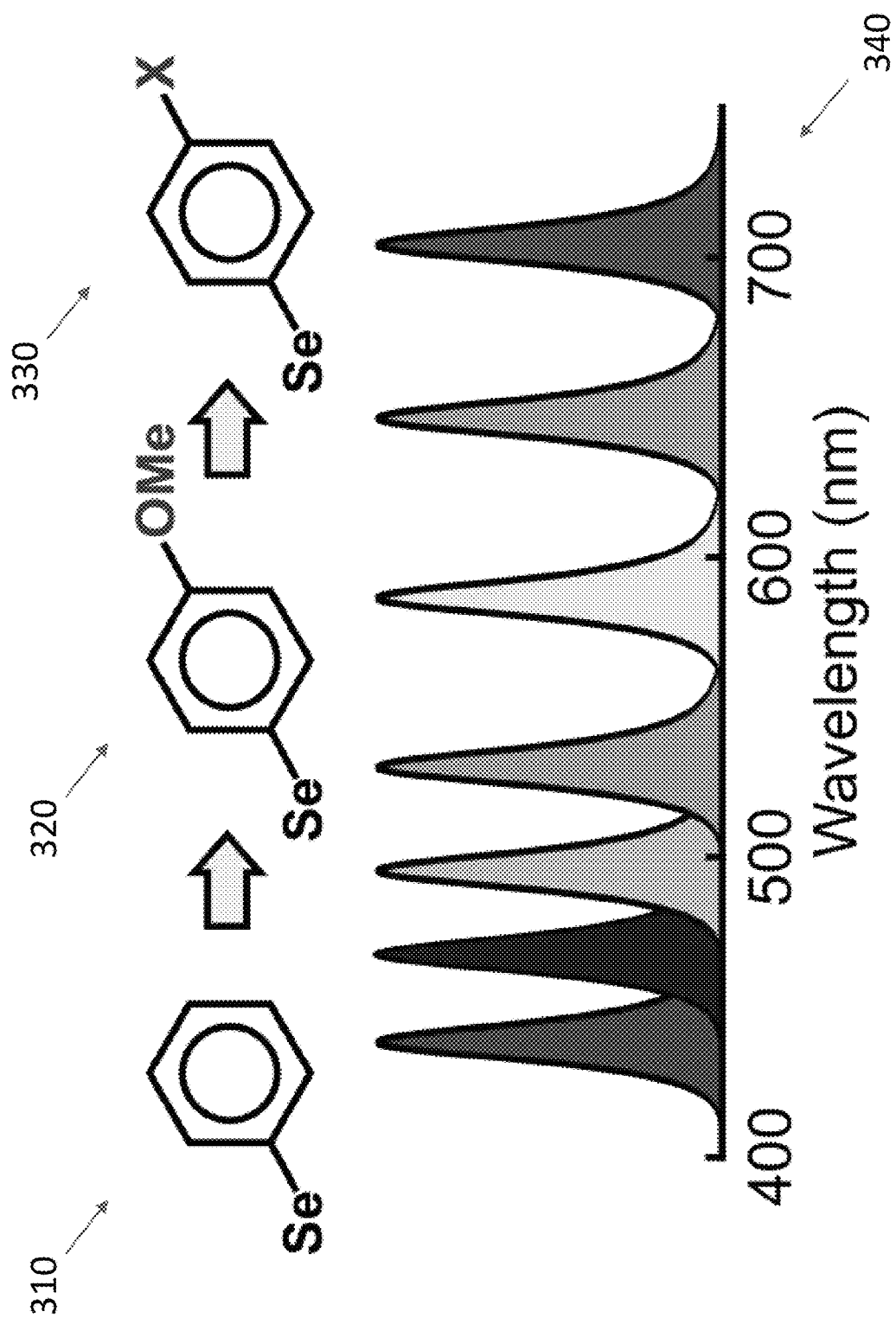
FIG. 3 shows band gap tuning with organic modification.

FIG. 3 shows a strategy to tune the band gap and the emission spectrum of AgSePh using organic functionalization. The covalent bonding in AgSePh provides an opportunity for bandgap tunability. By adding organic functional groups to the phenyl ring in the phenylselenolate anion 310, the bandgap and emission spectrum can be shifted. A functional group (X) may be introduced at the ortho, meta, or para position of the phenyl ring to make a functionalized phenylselenolate anion 330. As an example, FIG. 3 shows a phenylselenolate 320 functionalized with a methoxy functional group at the para position. Functionalized silver phenylselenolate (AgSePh-X) has an emission spectrum that is shifted to either higher or lower wavelengths relative to the emission of non-functionalized AgSePh centered around 467 nm, as shown in the schematic 340 in FIG. 3.

Figure 4:
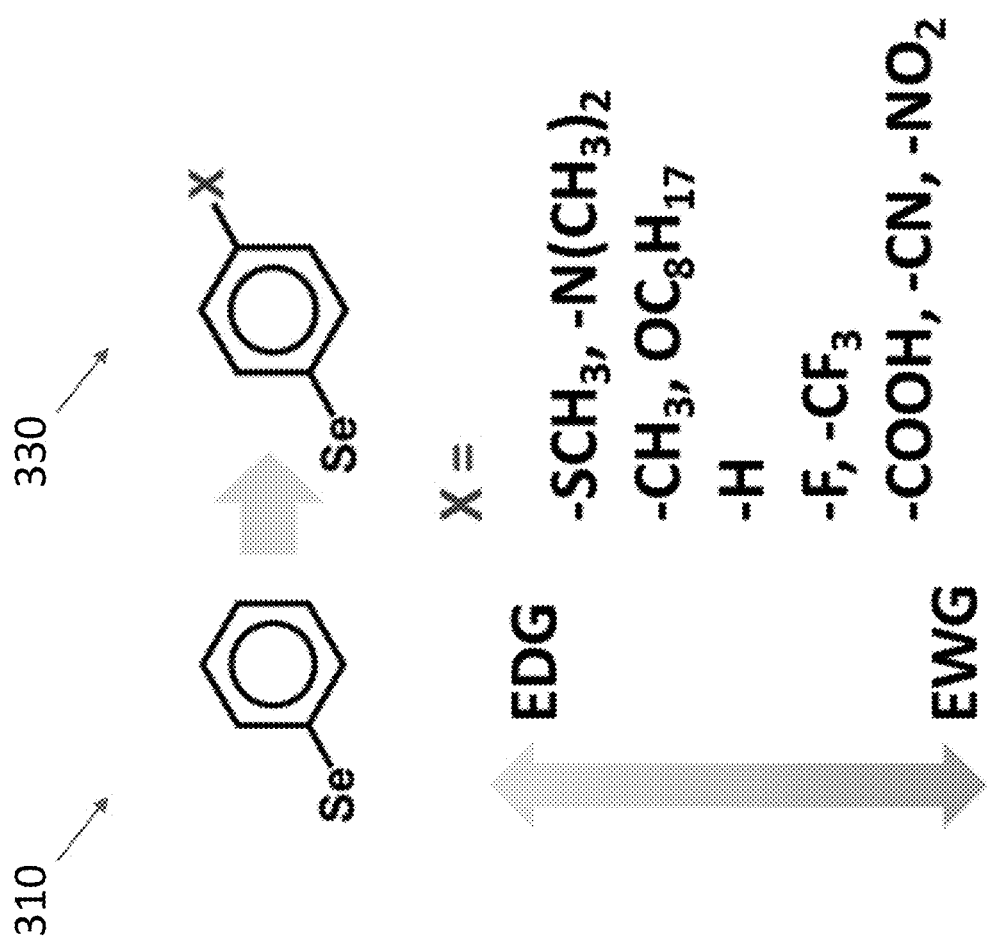
FIG. 4 shows organic functional groups for the organic modification in FIG. 3.

FIG. 4 shows several types of functional groups that can be used to functionalize the phenylselenolate anion 310 in AgSePh to make AgSePh-X with a functionalized phenylselenolate anion 330. These groups can be classified in terms of their electron donating nature or their electron withdrawing nature. Electron donating groups (EDGs) are atoms or functional groups that donate some of their electron density into a conjugated π system via resonance or inductive effects, making the π system more nucleophilic. Electron withdrawing groups (EWGs) remove electron density from a π system via resonance or inductive effects, making the π system less nucleophilic. EDGs include methyl ($CH_3$), methoxy ($OCH_3$), dimethylamine ($N(CH_3)_2$), thiomethyl ($SCH_3$), and alkoxy ($OC_xH_y$) where x is between about 2 and about 12 (e.g., 2, 3, 4, 5, 6, 7, 8, 9, 10, 11, or 12). $SCH_3$ and $N(CH_3)_2$ are stronger donors than methyl ($CH_3$), and alkoxy ($OC_xH_y$). EWGs include fluorine (F), trifluoromethyl ($CF_3$), carboxy (COOH), cyanide (CN), and nitro ($NO_2$). COOH, CN and $NO_2$ are stronger withdrawing groups than $CF_3$.

Figure 5A:
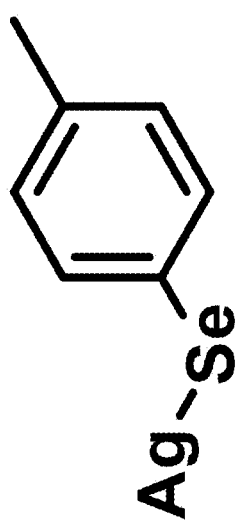
FIG. 5A shows the molecular structure of $AgSePh-CH_3$.
Figure 5B:
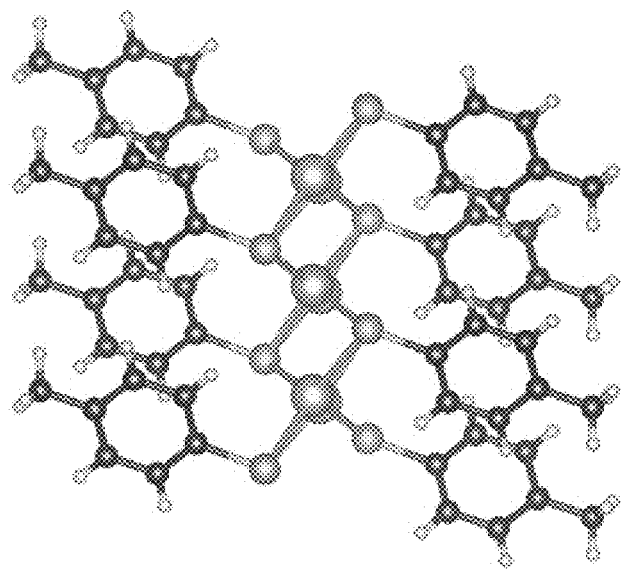
FIG. 5B shows the crystal structure of $AgSePh-CH_3$.
Figure 5B:
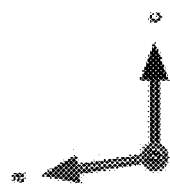

FIG. 5A shows the molecular structure of the organic ligand in AgSePh-$CH_3$ and FIG. 5B shows the crystal structure of AgSePh-$CH_3$. The crystal structure of AgSePh-$CH_3$ was confirmed with single-crystal X-ray diffraction (SC-XRD). AgSePh-$CH_3$ has a two-dimensional lamellar structure like that of AgSePh.

Figure 6A:
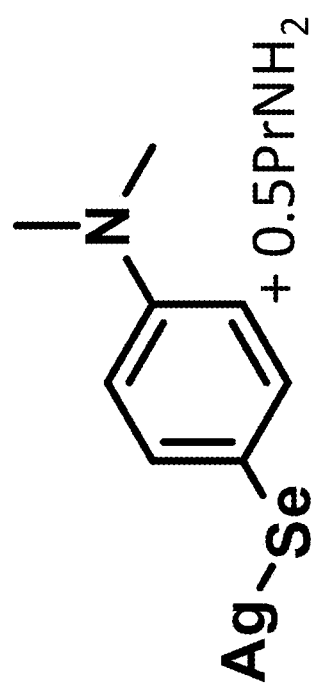
FIG. 6A shows the molecular structure of AgSePh-N$(CH_3)_2$.
Figure 6B:
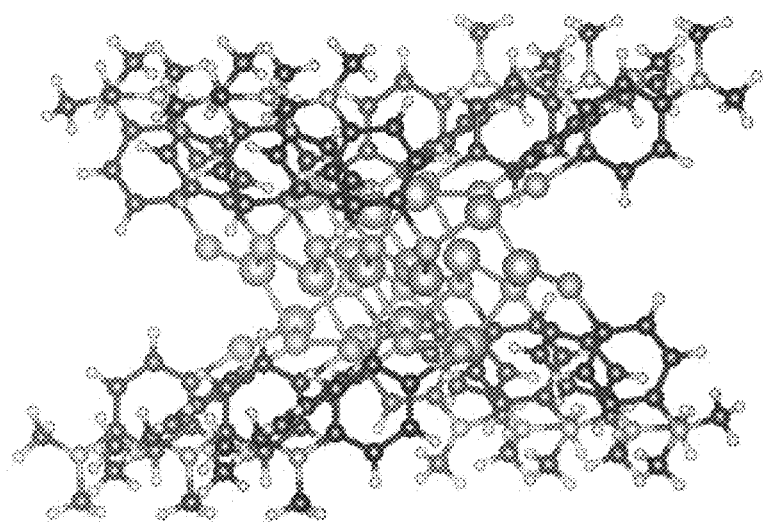
FIG. 6B shows the crystal structure of AgSePh-N$(CH_3)_2$.
Figure 6B:
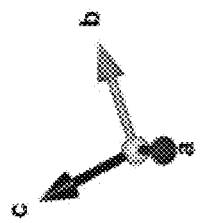

FIG. 6A shows the molecular structure of the organic ligand in AgSePh-$N(CH_3)_2$ and FIG. 6B shows the crystal structure of AgSePh-$N(CH_3)_2$. The crystal structure of AgSePh-$N(CH_3)_2$ was confirmed with SC-XRD, which indicated that AgSePh-$N(CH_3)_2$ has a one-dimensional structure. SC-XRD also indicated that this MOC was co-crystallized with $PrNH_2$.

The donating or withdrawing nature of the functional group on AgSePh-X shifts the emission spectrum to either higher or lower wavelengths, respectively, relative to the emission of non-functionalized AgSePh. Without being bound by any particular theory, it is believed the amount of the wavelength shift may be correlated to the strength of the EDG or EWG, with stronger donors causing larger shifts to higher wavelengths and stronger withdrawing groups causing larger shifts to lower wavelengths.

Figure 7:
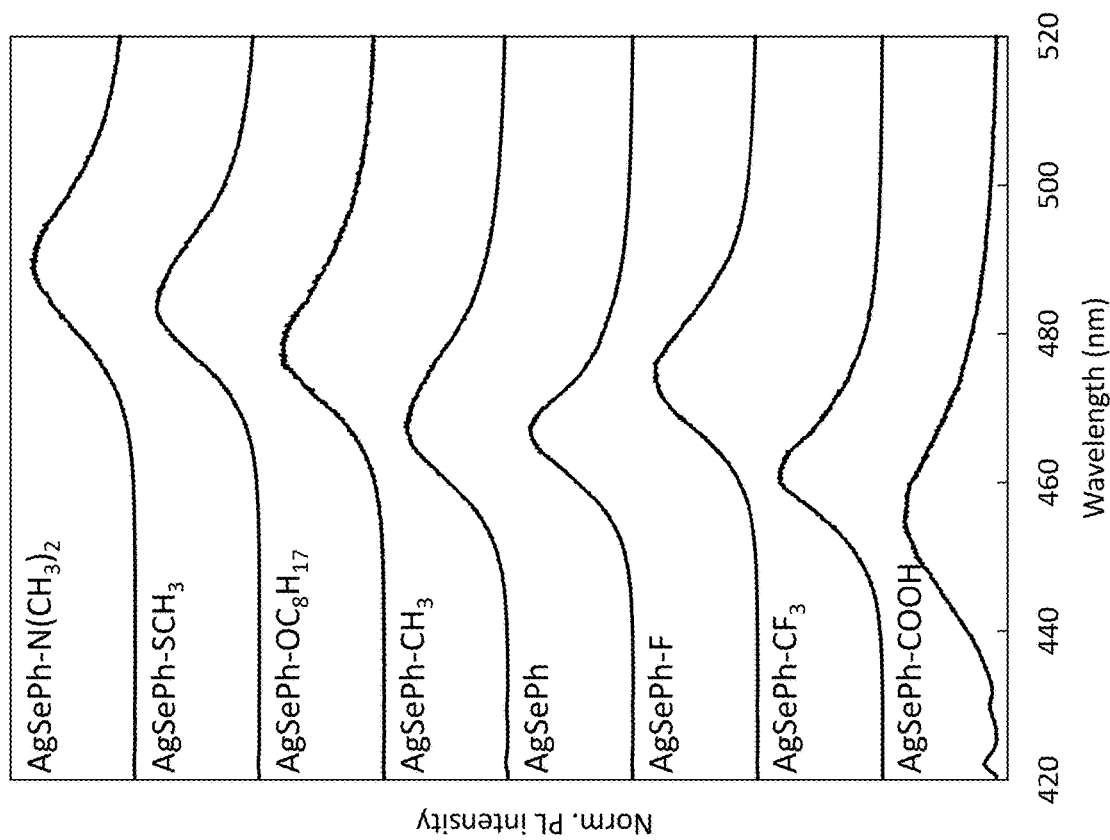
FIG. 7 shows emission spectra of AgSePh-X.

FIG. 7 shows the emission spectra for several AgSePh-X MOCs functionalized at the para position compared to non-functionalized AgSePh. Under room temperature photo-excitation by a 405 nm laser diode, non-functionalized AgSePh showed narrow blue emission with a peak emission at 467 nm. Like AgSePh, AgSePh-COOH, AgSePh-$CF_3$, AgSePh-F, AgSePh-$CH_3$, AgSePh-$OC_8H_{17}$, AgSePh-$SCH_3$, and AgSePh-$N(CH_3)_2$ also exhibited narrow blue emission but with different peak emission positions. MOCs functionalized with EDGs all had peak emission positions greater than 467 nm. AgSePh-$OC_8H_{17}$, AgSePh-$N(CH_3)_2$, AgSePh-$CH_3$, AgSePh-$SCH_3$ displayed peak emissions at 477 nm±3 nm, 489 nm±3 nm, 468 nm±3 nm, and 483 nm±3 nm, respectively. The MOC functionalized with an EWG had a peak emission position less than 467 nm. For example, AgSePh-COOH, AgSePh-$CF_3$, AgSePh-F displayed a peak emission at 452 nm±3, 461 nm±3 nm, 473 nm±3, respectively. These results indicate that introducing EDGs induced photoluminescent peak red-shift (to higher wavelengths) and EWGs induced photoluminescent peak blue-shift (to lower wavelengths). Molecular engineering of organic moiety provided tuning of the photoluminescent emission between about 450 to about 490 nm.

This functionalization strategy could be applied to other MOCs. For example, other chalcogens, including sulfur and tellurium, may be wholly or partially substituted into the selenium positions in the structure of the MOC (e.g., $[Ag(SR)]_n$ or $[Ag(TeR)]_n$). Replacing Se with S may increase the size of the bandgap and shift the photoluminescent peak to a shorter wavelength. Replacing Se with Te may decrease the size of the bandgap and shift the photoluminescent peak to a longer wavelength. Other metals, including copper and gold, may be wholly or partially substituted into the silver positions in the structure of the MOC. Replacing Ag with Cu may increase the size of the bandgap and shift the photoluminescent peak to a shorter wavelength. Replacing Ag with Au may increase the size of the bandgap and shift the photoluminescent peak to a longer wavelength.

Heteroaromatic MOCs $[Ag(SeR)]_n$ MOCs may include heteroatoms in the R group. For example, the R group may be an aryl ring with one or two heteroatoms. Heteroatoms include O, S, Se, Te, N, P, As, B, and Al. The heteroatom may be in an ortho, para, or meta position in the aryl ring.

Heteroatoms may provide MOCs with different optoelectronic and morphological properties. MOCs with heteroatoms may have different band gap sizes and shifted photoluminescent peak wavelengths. MOCs with heteroatoms may have different photoluminescent peak widths. Heteroatoms may also provide MOCs with different structural dimensions (e.g., 0D, 1D, 2D, or 3D structures). Some heteroatoms have lone pair electrons which may coordinate with metal cations to determine structural dimensions. The structural dimensions depend on the location of the substituted heteroatom, steric effects of the ligands, and the strength of the interaction between metals and the heteroatoms. As described above, there may be a relationship between structural dimensions and the linewidth of the photoluminescent emission peak To provide control over MOC structural dimensions, MOCs with heteroaromatic rings containing nitrogen atoms were developed. Without being bound by any particular theory, it is believed that the nitrogen in the heteroaromatic rings can coordinate with metal centers in the MOCs to create different structural motifs. This class of materials has a wide variety of complex structures with different geometries, including clusters (0D) and chain structures (1D).

The structural dimensions of MOCs are largely determined by steric effects and bonding within the material. Larger organic molecules in the R groups increase steric effects, and therefore have lower-dimensional structures (1D or 0D). The position of the R group also determines steric effects. For example, bulkier R groups like $N(CH_3)_2$ at the para position form 1D structures, while R groups smaller than $N(CH_3)_2$ at the ortho position may also form 1D structures. Smaller inorganic cores (metal and chalcogen atoms) may accommodate smaller organic molecules, which have lower-dimensional structures (1D or 0D). Intra- and inter-molecular interactions (e.g., covalent bonds, hydrogen bonds, or Van der Waals forces) also affect structural dimensions of MOCs. The structure of a molecule depends on all interactions and bonding presence in that molecule. So, if there is an additional force/interaction present, then it can affect the structure. For example, comparing between AgSePh and AgSePy, the interaction between Ag and N in AgSePy results in the change of the structure from 2D in AgSePh to a cluster in AgSePy.

Figure 8A:
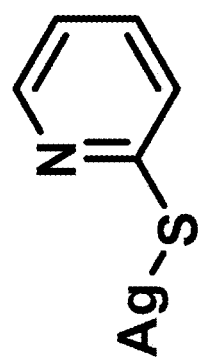
FIG. 8A shows the molecular structure of AgSPy.
Figure 8B:
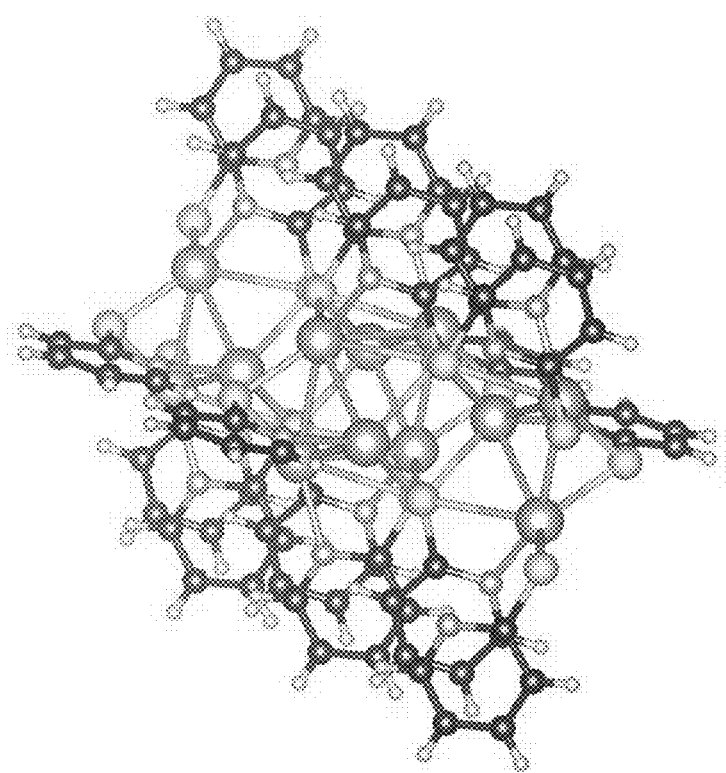
FIG. 8B shows the crystal structure of AgSPy.

FIGS. 8A-12B show different views of example MOCs with heteroaromatic rings and different geometries. FIG. 8A shows the molecular structure of the organic ligand in silver pyridyl thiolate (AgSPy), an MOC with a pyridine ring. FIG. 8B shows the crystal structure of AgSPy confirmed with SC-XRD. AgSPy forms a one-dimensional (1D) chain structure along the a-axis. FIG. 10A shows the molecular structure of the organic ligand in silver pyridyl selenolate (AgSePy), another MOC with a pyridine ring. FIG. 10B shows the crystal structure of AgSePy confirmed with SC-XRD. AgSePy forms a 0D cluster. AgSePy was a highly emissive molecular crystal with several advantageous properties. AgSePy has a long luminescence lifetime and exhibits emission at high temperatures. AgSePy is stable at high temperatures. AgSePy is also stable in many polar solvents (e.g., water, methanol, ethanol, isopropanol, other alcohols, dimethyl formamide, dimethyl sulfoxide) and non-polar solvents (e.g., hexane and toluene). Furthermore, AgSePy can be easily deposited as a thin film (2D) on a substrate (e.g., a glass substrate), as described in more detail below.

Figure 9:
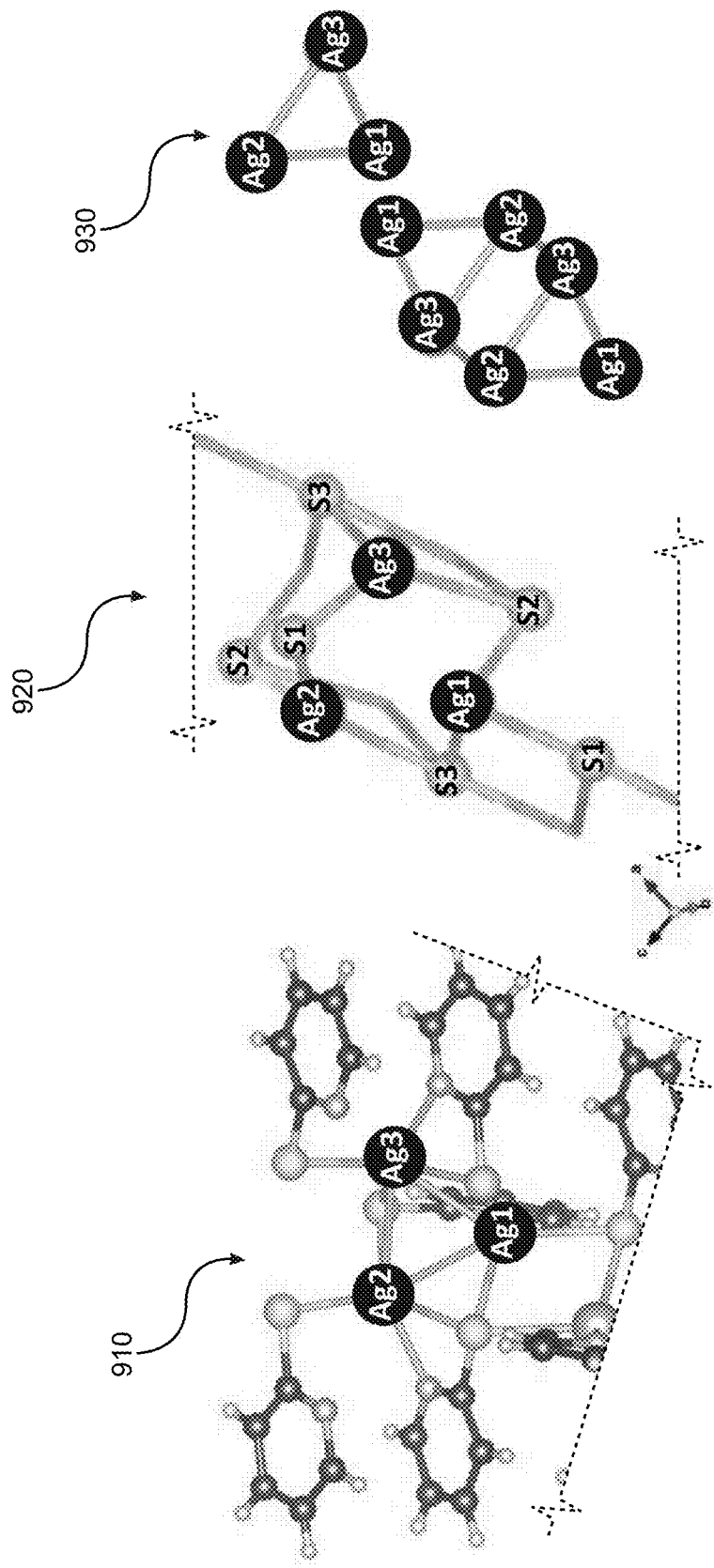
FIG. 9 shows additional views of the structure of AgSPy shown in FIG. 8B.
Figure 10A:
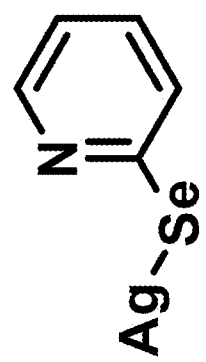
FIG. 10A shows the molecular structure of AgSePy.
Figure 10B:
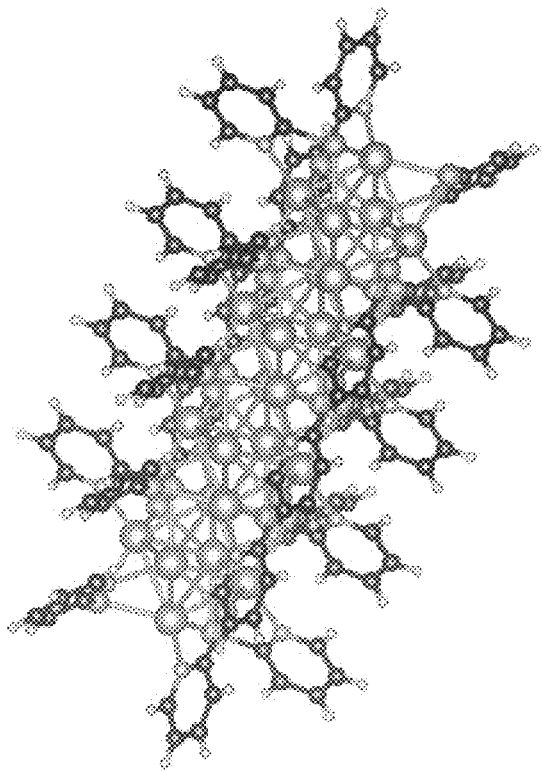
FIG. 10B shows the crystal structure of AgSePy.
Figure 10B:
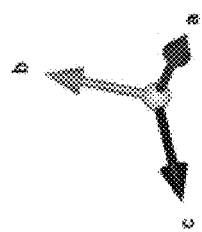

FIG. 9 shows additional views of the crystal structure of AgSPy. FIG. 9 (left) shows the arrangement 910 of Ag atoms coordinated by ligands in the crystal structure. FIG. 9 (center) shows the arrangement 920 of sulfur atoms coordinated to Ag atoms. FIG. 9 (right) shows the alignment 930 of Ag triangles. Single-crystal X-ray diffraction analysis revealed the structure of AgSPy. The structure of AgSPy includes three silver (Ag) atoms that form triangles with an average Ag—Ag atomic distance of about 2.9387 to about 3.0592 Å. Ag atoms are coordinated by three sulfur atoms and one nitrogen atom from three ligands. The three sulfur (S) atoms act as a $\mu_2$ (S1) bridge, a $\mu_2$ (S2) bridge, and $\mu_4$ (S3) bridge, respectively, linking silver centers. Each silver triangle is bridged by an S1 atom, an S2 atom, and an S3 atom. The distance between adjacent silver triangles is about 3.2855 Å for Ag2-Ag3 and about 3.3894 Å for Ag1-Ag1. The Ag atoms in a AgSPy cluster are placed within a distance of each other less than the sum of van der Waals radius of an Ag atom (3.4 Å). All pyridine rings are stacked along the a-axis. The pyridine rings connecting to S2 and S3 are facing each other in a single 1D chain structure, while the pyridine ring connecting to the S1 atom stacks with the pyridine ring connecting to the S1 atom from adjacent 1D chain.

Figure 11:
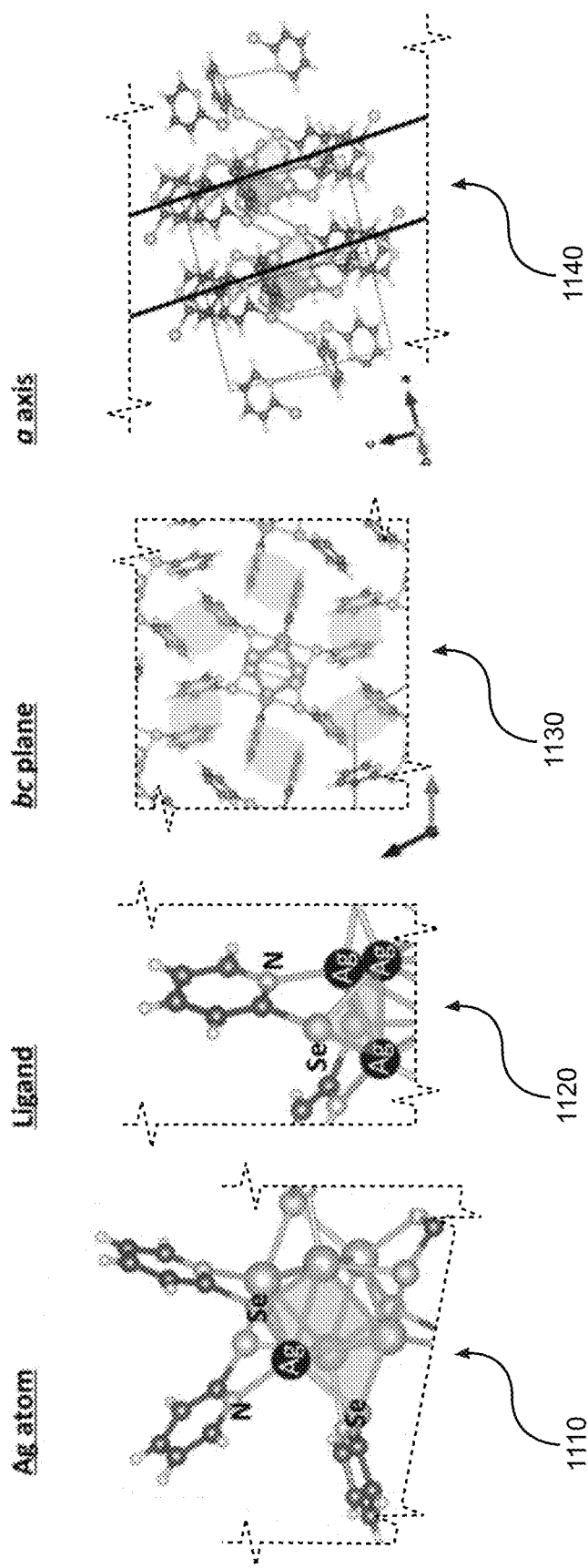
FIG. 11 shows additional views of the structure of AgSePy shown in FIG. 10B.
Figure 12:
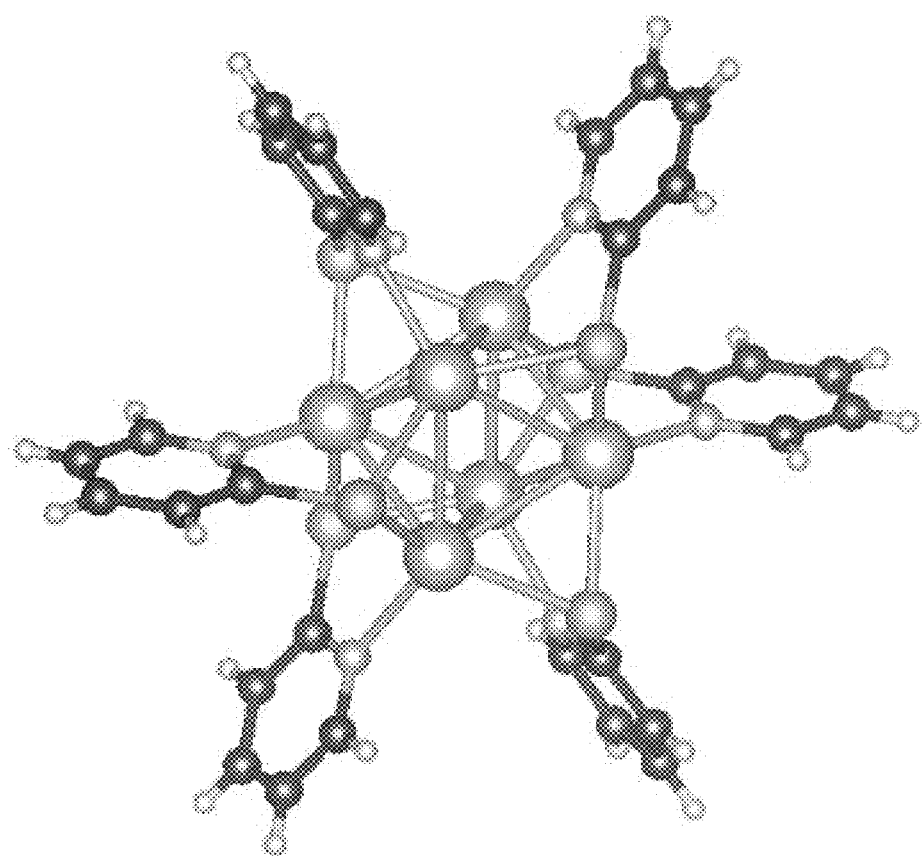
FIG. 12 shows the structure of a AgSePy cluster.

FIGS. 11-12 show additional views of the crystal structure of AgSePy. FIG. 11 (left) shows the arrangement 1110 of Ag atoms coordinated by organic ligands. FIG. 11 (center left) shows the arrangement 1120 of organic ligands coordinated to Ag atoms. FIG. 11 (center right) shows the higher-order structure 1130 of AgSePy in the bc plane. FIG. 11 (right) shows the higher-order structure 1140 of AgSePy along the a-axis. FIG. 12 shows the structure 1230 of an AgSePy cluster.

Single-crystal X-ray diffraction analysis also revealed the structure of AgSePy. The structure of AgSePy includes an octahedral core of six silver atoms. The structure includes six pyridyl selenolate ligands. Each silver atom is coordinated by two selenium atoms and one nitrogen atom from three pyridyl selenolate ligands. The AgSePy clusters expand to a 2D network in the bc plane via interactions between clusters with a plane-to-plane distance of 3.6956-3.9618 Å. Silver hexanuclear cores are oriented along the a-axis with a distance between cores of 3.4892 Å. The distance between two selenium atoms in two different cores is close to the sum of van der Waals radii of two selenium atom (3.8 Å), indicating weak Se—Se interaction between two clusters.

Figure 13A:
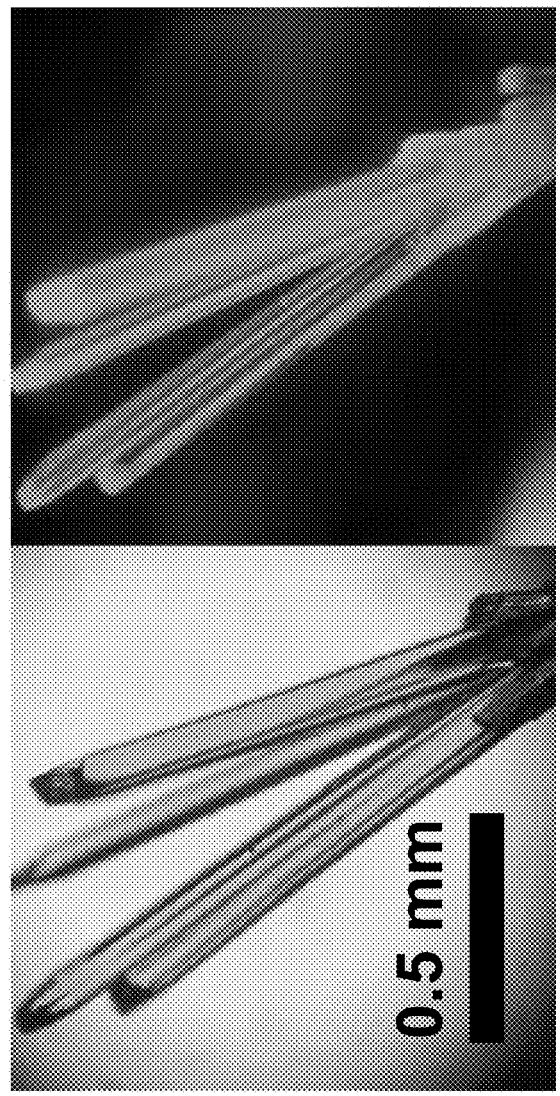
FIG. 13A shows an optical image of AgSePy under broad spectrum and UV light.
Figure 13B:
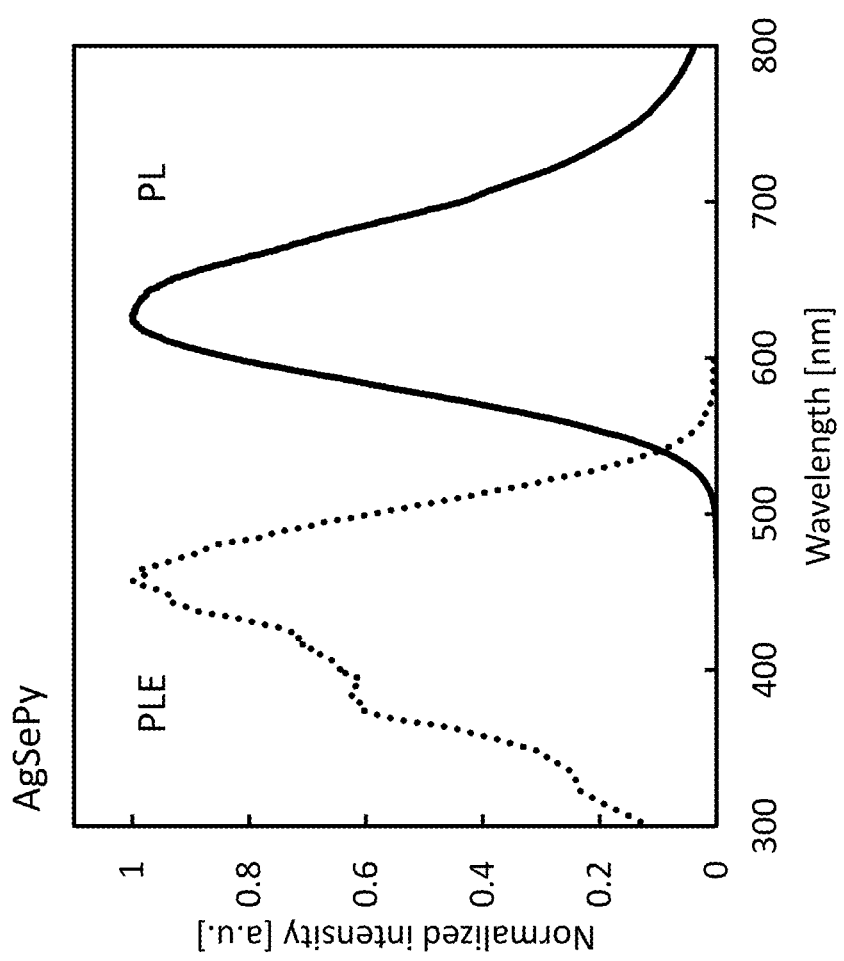
FIG. 13B shows the excitation and emission spectra of AgSePy.
Figure 14:
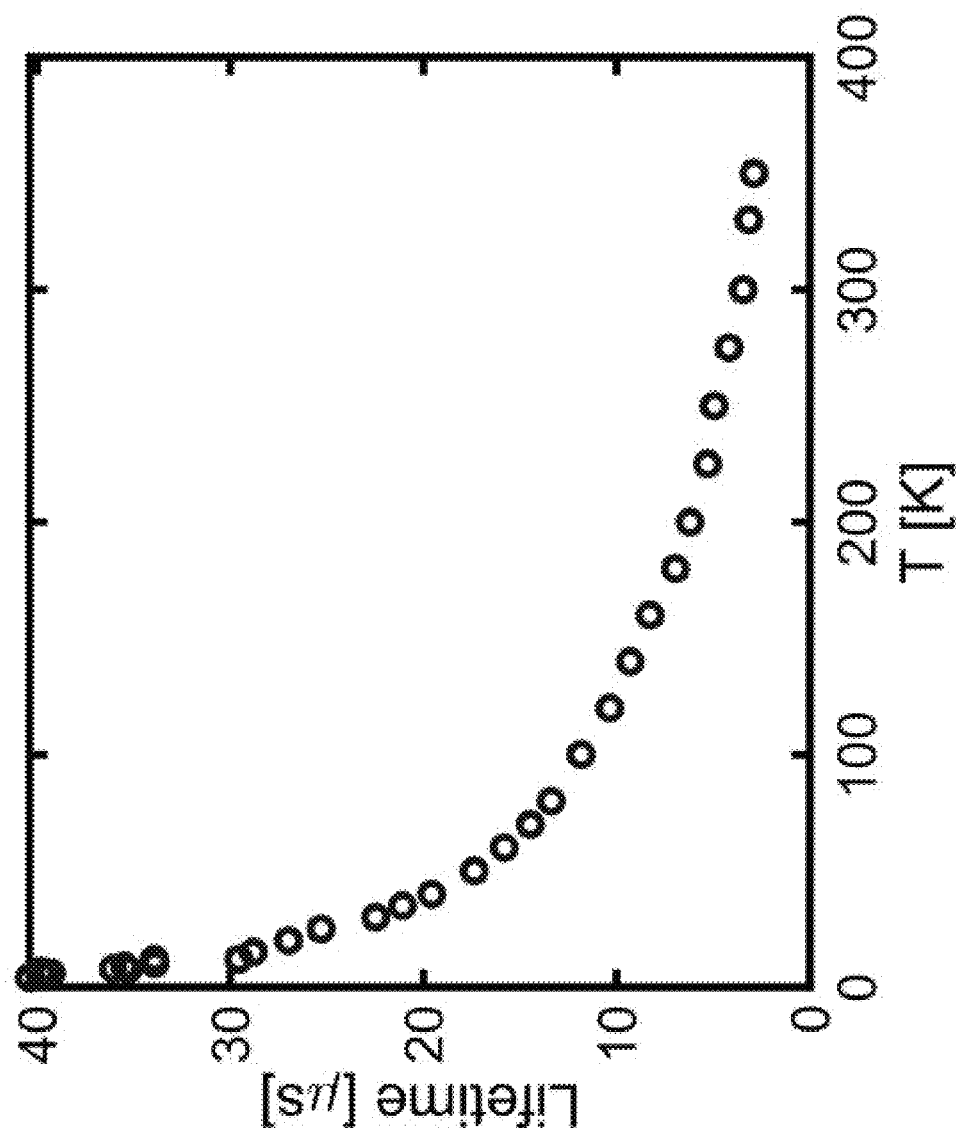
FIG. 14 shows the photoluminescent lifetime of AgSePy emission at different temperatures.

FIG. 13A shows an optical image of the emission of AgSePy under UV light (right) at about 365 nm and under broad spectrum light (left). FIG. 13B shows the emission and excitation spectra of AgSePy. AgSePy exhibited orange emission centered at 628 nm±3 nm. The excitation spectrum of AgSePy had a peak at 461 nm±3 nm. FIG. 14 shows the photoluminescent lifetime of AgSePy at different temperatures. At 300 K, the emission decay of AgSePy was single exponential, and the decay time was 4.1 µs. This relatively long decay time (>1 µs) may indicate that the electronic transition related to the emission involves a transition from a forbidden state, such as a triplet excited state. Decay time was measured at temperatures between 5 K and 350 K. Decay time was longer at lower temperatures. AgSePy exhibited significant emission at temperatures as high as about 150° C.

Other MOCs with heteroaromatic ligands such as 2-pyrimidineselenol, 2-quinolineselenol, 2-pyridinethiol, and mercapto-2-benzothiazole, also exhibited luminescent properties. Specifically, MOCs with organic ligands with a nitrogen atom and a chalcogen atom separated by a carbon atom showed luminescence. Other chalcogens, including sulfur and tellurium, may be wholly or partially substituted into the selenium positions in the structures of these heteroaromatic MOCs. Other metals, including copper and gold, may be wholly or partially substituted into the silver positions in the structures of these heteroaromatic MOCs. Different structures have emission peaks in different wavelength ranges of the visible spectrum of light (e.g., in the red, orange, and yellow parts of the visible spectrum of light).

MOCs with Large Aromatic Rings

Increasing the size of the Pi-conjugated rings in MOCs provides several beneficial optical properties. MOCs with organic ligands include extended conjugation systems. Extended conjugation systems include, for example, fused aromatic rings (i.e., molecular structures that include two or more aromatic rings with at least two carbon atoms in common between each aromatic ring) and biaryl rings. Examples of fused aromatic rings that may be incorporated into MOCs include naphthalene, anthracene, phenanthrene, benzanthracene, dibenzanthracene, pyrene, benzopyrene, chrysene, corannulene, coronene, and [n]helicenes, where n is 5 to about 8. Examples of biaryl rings include biphenyl, binaphthyl, and bipentacene.

Figure 15A:
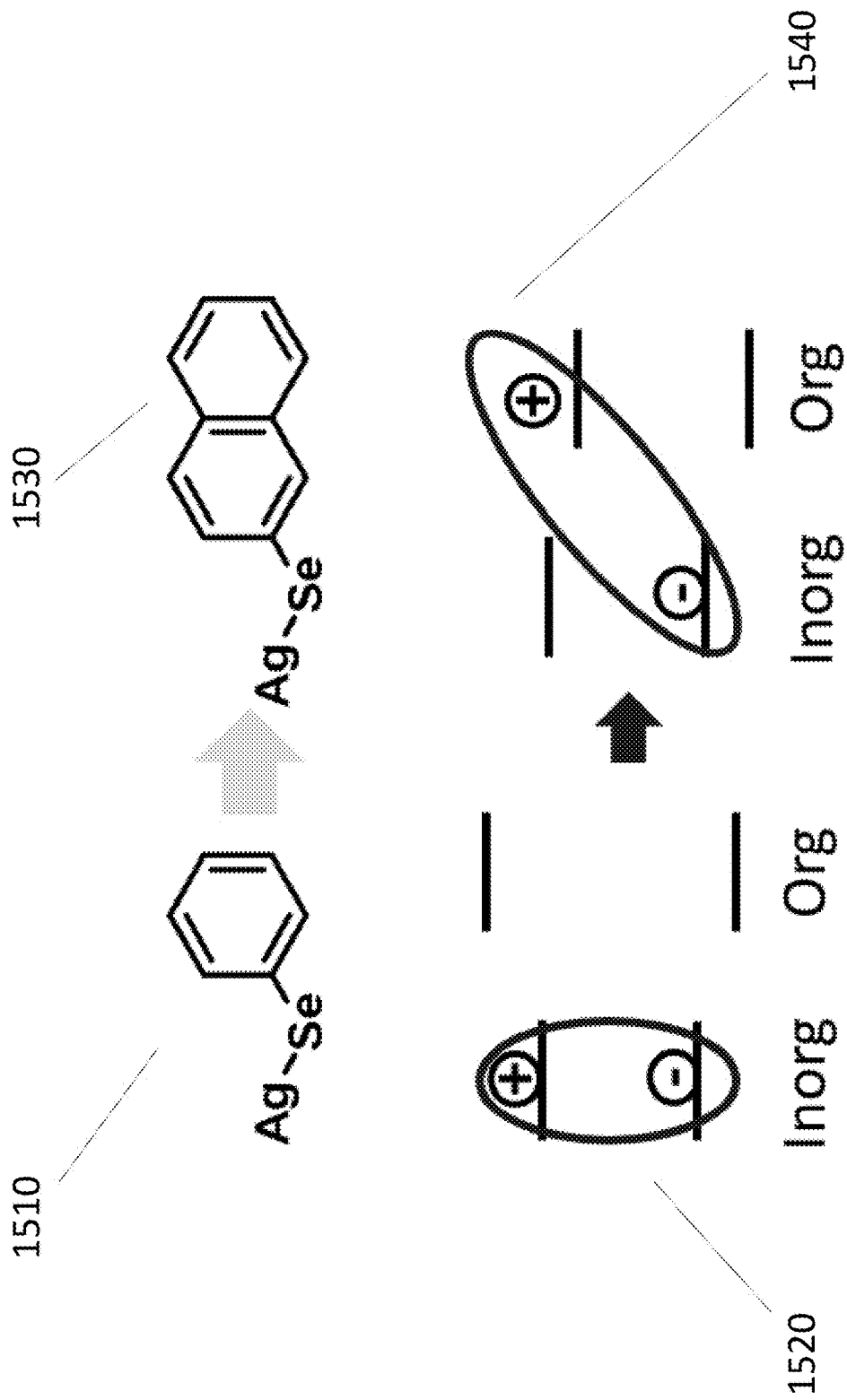
FIG. 15A shows electronic states in AgSePh and in silver 2-naphthylselenolate (AgSeNapht).

FIG. 15A illustrates a possible mechanism of exciton stabilization present in MOCs with fused aromatic rings. Compared to benzene rings, fused aromatic rings have smaller band gaps. Without being bound by any particular theory, it is believed the larger band gap in the phenyl ring reduces the contribution from the phenyl ring to the band structure of the MOC with a phenyl ring. In MOCs with phenyl rings, like AgSePh 1510, exciton 1520 is localized in the inorganic electronic orbitals, as shown in FIG. 15A (left). The smaller band gaps in fused aromatic rings may increase hybridization of the organic and inorganic electronic orbitals within the MOCs. The increased hybridization may change the band structure of MOCs so that electrons may be distributed in the organic molecule in the valence band maximum (VBM) or conduction band minimum (CBM). These MOCs may experience electronic transitions from the ligand to the metal or vice versa. FIG. 15A (right) shows silver 2-naphtyl selenolate (AgSeNapht) 1530 and its exciton 1540 hybridized across the inorganic and organic orbitals. As a result, the exciton 1540 may be stabilized, resulting in longer luminescence lifetimes.

Figure 15B:
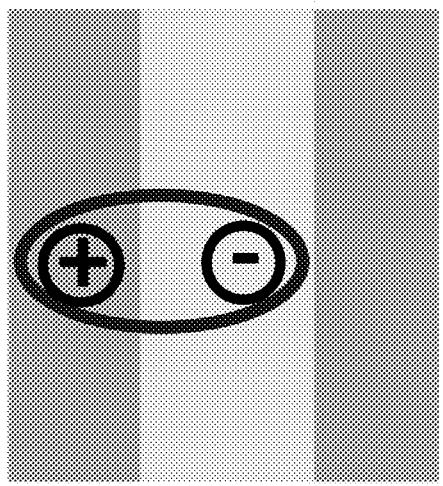
FIG. 15B shows dipole orientation in AgSePh and AgSeNapht.
Figure 15B:
Figure 15B:
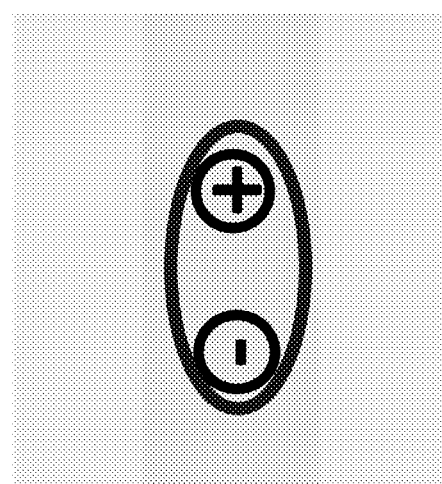

FIG. 15B illustrates a method of controlling dipole orientation using fused aromatic ring ligands. The dipole orientation of AgSePh lies in the 2D plane. MOCs with fused aromatic rings may sustain excitons with out-of-plane transitions. Using fused aromatics rings may result in the electronic structure shown in FIG. 15A (right) where the electron and hole are separated into organic and inorganic parts of the MOC. In the case of 2D MOCs, the inorganic part is sandwiched between two layers of the organic part. If the electron and hole stay within the inorganic part (FIG. 15B left), then they form an exciton whose dipole orientation lies within the plane. On the other hand, if the electron and hole are separated into different components (FIG. 15B right), they form an exciton whose dipole orientation lies out of plane.

Figure 16:
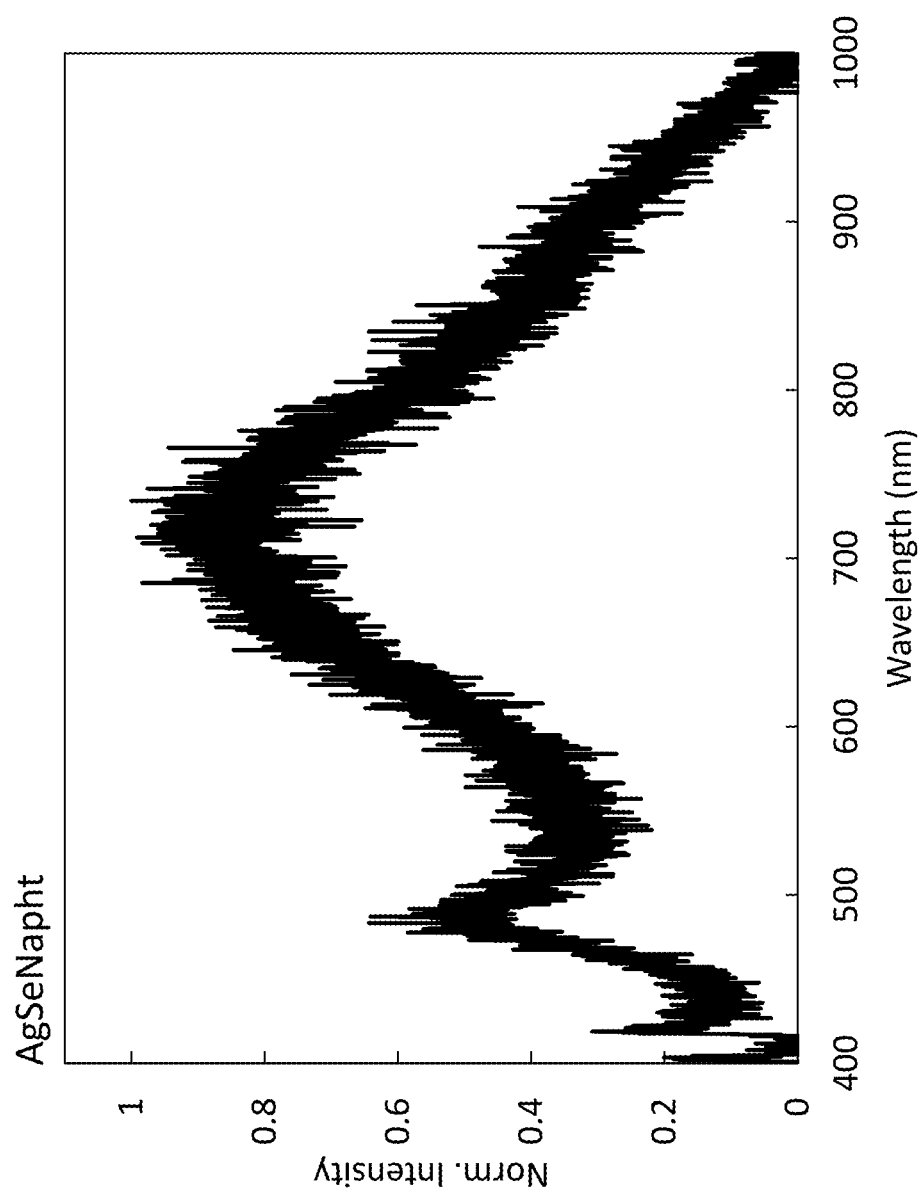
FIG. 16 shows photoluminescence spectra of AgSeNapht.

FIG. 16 shows a photoluminescence spectrum of silver 2-naphtyl selenide (AgSeNapht). Broad photoluminescence with its peak around 700 nm was observed.

Synthesis of MOCs

Figure 17:
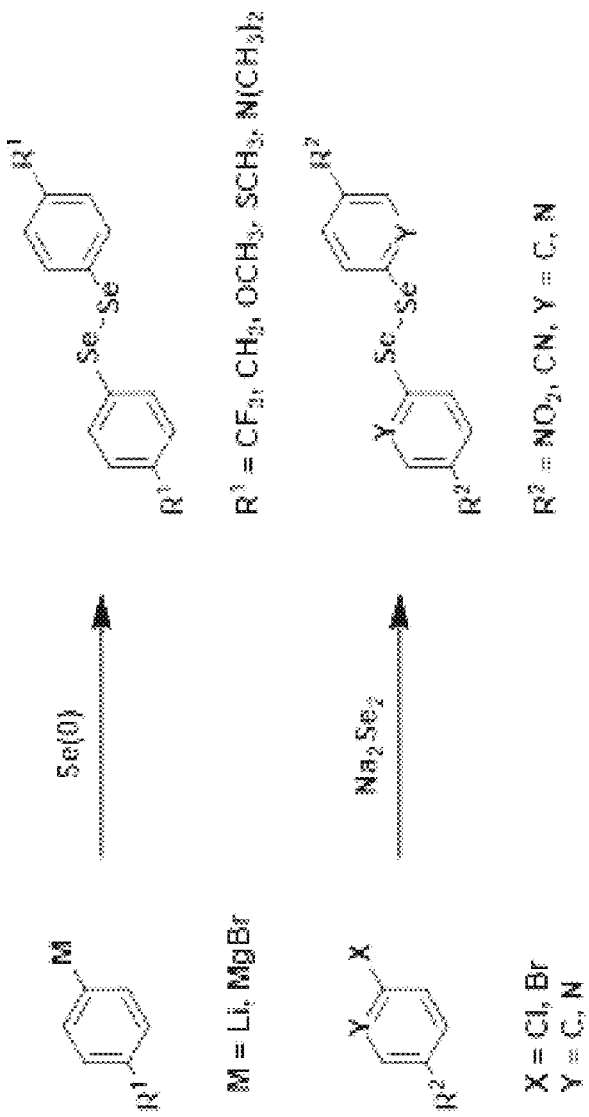
FIG. 17 shows organoselenium synthesis schemes.

MOCs were prepared from metal species (e.g., metal or metal salt) and organoselenium compounds, including organo-diselenides. Organo-diselenides were synthesized using one of two approaches. One approach was the reaction between either an organolithium or a Grignard reagent and elemental selenium. The second approach was the reaction of disodium diselenides and aromatic halides with electron withdrawing groups or electron donating groups. The two approaches are shown in the scheme in FIG. 17. FIG. 17 shows the synthesis approaches for making organoselenium compound starting materials that are used to form functionalized AgSePh-X with the functional group at the para position. These synthesis approaches may be used to form other forms of MOCs, including those described above.

Several starting materials were synthesized or obtained to create different MOCs. As an example, to synthesize functionalized silver phenylselenolate (AgSePh-X), the starting materials included 1,2-bis(4-methylphenyl) diselenide, 1,2-bis(4-(dimethylamino)phenyl) diselenide, 1,2-bis(4-(thiomethyl)phenyl) diselenide, 1,2-bis(4-(trifluoromethyl)phenyl) diselenide, 1,2-bis(4-cyanophenyl) diselenide, and 1,2-bis (4-nitrophenyl) diselenide. To synthesize MOCs with heteroaromatics, the starting materials included 1,2-bis(2-pyridyl) diselenide, 1,2-bis(2-pyrimidyl) diselenide, 1,2-bis (2-pyridyl) dithiolate, 2-mercaptopyrimidine, and 2-mercaptobenzothiazole. As an example, to synthesize MOCs with larger aromatic rings, the starting materials included 1,2-bis(2-napthyl) diselenide.

Figure 18A:
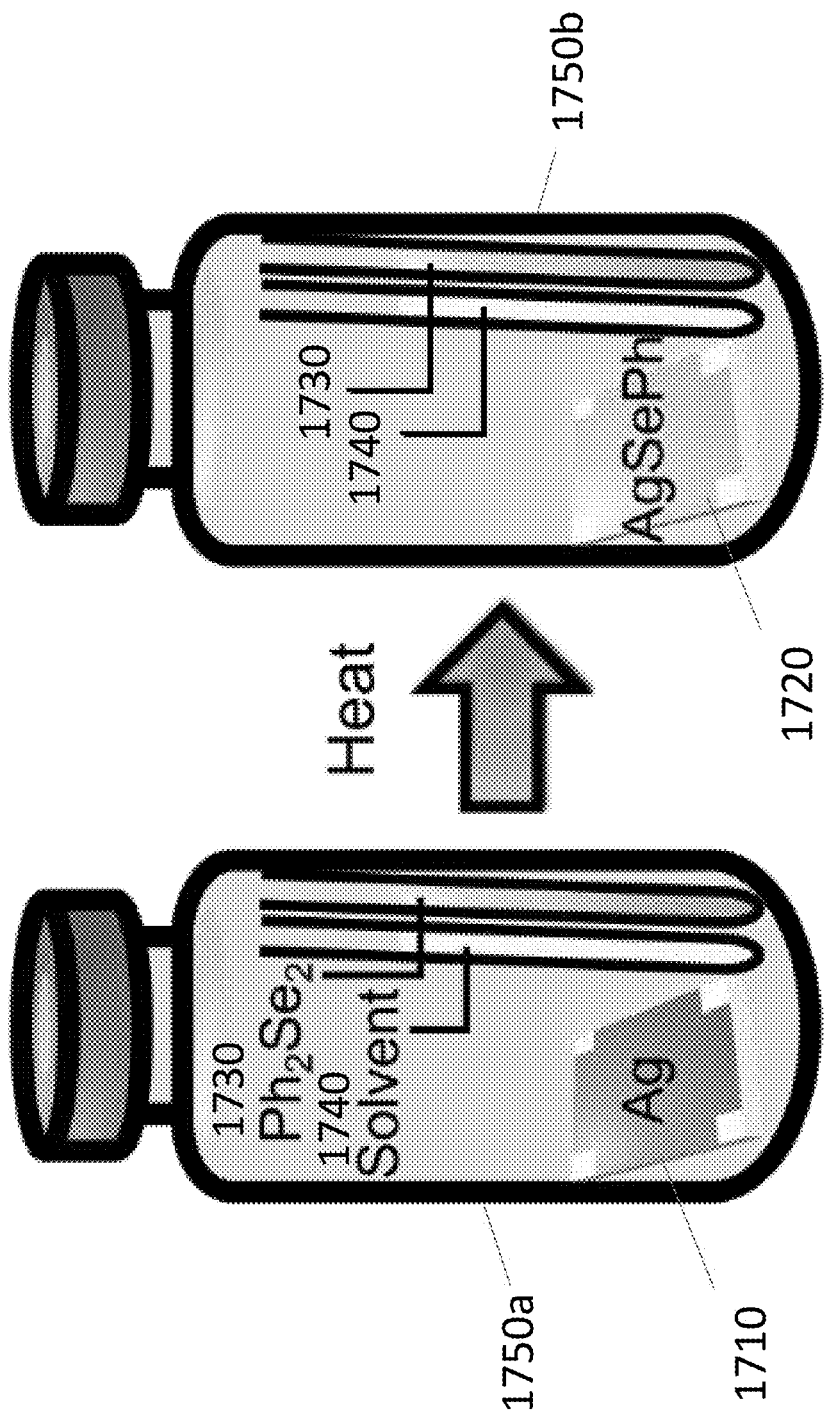
FIG. 18A shows a schematic of a reaction vessel for synthesizing metal organic chalcogenolates via a vapor-phase method.
Figure 18B:
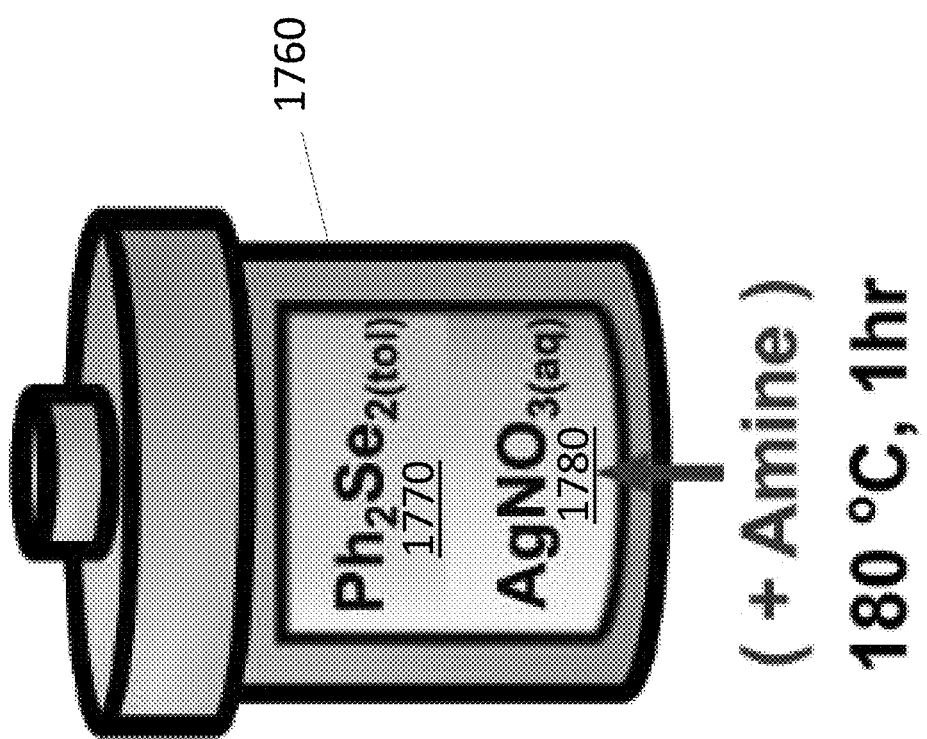
FIG. 18B shows a schematic of a reaction vessel for synthesizing metal organic chalcogenolates via a biphasic hydrothermal method.
Figure 18C:
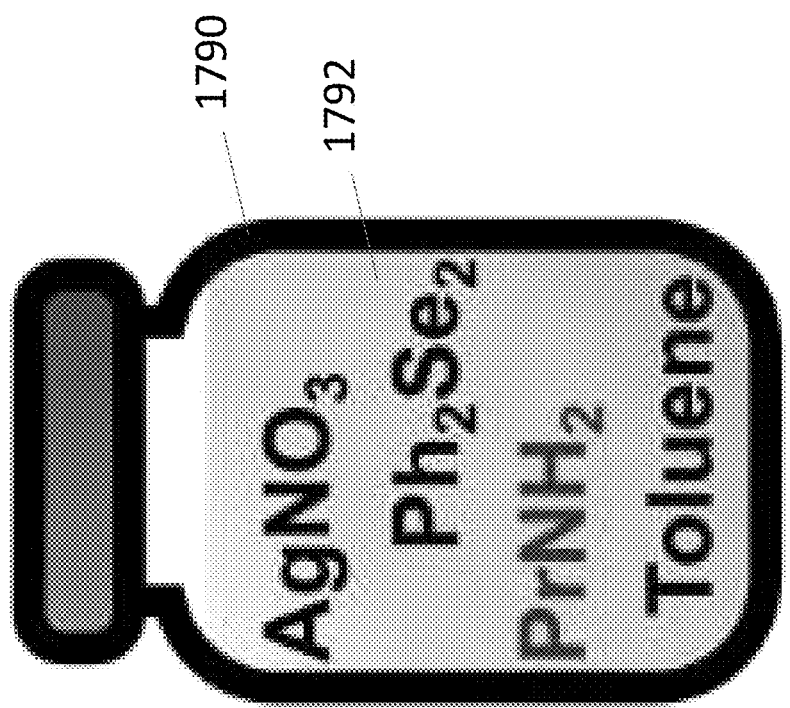
FIG. 18C shows a schematic of a reaction vessel for synthesizing metal organic chalcogenolates via a single-phase method.

FIGS. 18A-18C show three methods of making MOCs. MOCs can be prepared via different synthetic methods, including vapor-phase methods and solution-phase methods, to produce MOCs in different forms. The form of MOC, including thin films, microcrystals and single crystals, may be chosen based on the end use need. Previously reported methods of creating single crystal MOCs were intricate, multiple step processes using highly sensitive, reactive, and hazardous organolithium compounds. Compared to conventional multi-step methods of preparing single crystal MOCs, the methods presented here reduce the synthesis complexity to one step using stable reagents.

The synthesis methods presented here provide higher quality MOC crystals. Previous methods used to make MOC microcrystals resulted in small MOC crystals with average lateral sizes of <5 μm (e.g., about 2 μm). Because of their small size, these MOCs were not typically incorporated into devices. Integrating small MOC crystals into devices is challenging because of resolution constraints of conventional device fabrication equipment. Furthermore, these MOCs had poor optical and electrical properties, including optical and electrical signatures of mid-gap states that limit their optoelectronic performance. Here, by contrast, the two solution-phase methods shown in FIGS. 18B and 18C can produce large MOC crystals with improved optoelectronic properties. Both solution-phase methods used amine compounds to promote the formation of larger MOC crystals. These solution-phase methods produce MOC single crystals with at least one side with a dimension of about 5 μm to about 5 mm (e.g., about 5 μm, about 10 μm, about 20 μm, about 50 μm, about 100 μm, about 200 μm, about 500 μm, about 1 mm, or about 5 mm). MOC single crystals with these larger dimensions are more easily integrated into existing device fabrication systems.

FIG. 18A shows a schematic of a reaction vessel for synthesizing MOCs via a vapor phase method. The vapor phase method, also called a vapor tarnishing method, produces MOC thin films, which may be used in many optoelectronic applications. In this method, a metal film 1710 (e.g., silver) is transformed into an MOC film 1720 via reactions between the metal film 1710 and an organochalcogen compound 1730 (e.g., diphenyl diselenide or derivatives thereof) vapor in a sealed container 1750a. The time it takes for the reaction to complete depends on the thickness of the metal film and the reaction temperature. Metal films with larger thicknesses use longer reaction times, whereas increasing the temperature increases the rate of the reaction. For example, it takes about 2 days at 120° C. for a 15 nm thick silver film, about 3 days at 100° C. for a 15 nm thick silver film, and about 6 days at 100° C. for a 50 nm thick silver film for the reaction to go to completion. The sealed container 1750a is heated at a temperature such that the organic compound starting material melts and forms a vapor. The vapor then reacts with the metal film. The temperature at which the sealed container 1750a is heated is about 70° C.

to about 180° C. (e.g., 80° C., 100° C., 120° C., 150° C., or 180° C.). After reaction, the sealed container 1750b is cooled to room temperature.

The presence of a solvent 1740 in the sealed container during vapor phase synthesis changes several characteristics of the resulting MOC film 1720. These characteristics include the size of the MOC crystals in the MOC film 1720, the orientation of the MOC crystals (i.e., parallel or perpendicular to the plane of the substrate), and optoelectronic performance of the MOC film. Using dimethyl sulfoxide (DMSO), dimethylformamide (DMF) or propylamine ($PrNH_2$) solvents yielded large crystal sizes (>1 μm) with parallel crystal orientation with respect to the substrate. In comparison, using water solvent during synthesis yielded smaller crystals. Parallel crystal orientation may be useful for light-emitting devices, photodetectors, and field-effect transistors, where the parallel orientation may facilitate efficient charge transport.

FIG. 18B shows a schematic of a reaction vessel 1760 for synthesizing MOCs via a solution-phase, biphasic hydrothermal method. The biphasic hydrothermal method includes introducing an organic phase 1760 and an aqueous phase 1780 into a sealed reaction vessel. The organic phase 1760 includes an organoselenium compound. The aqueous phase 1780 includes a silver salt (e.g., $AgNO_3$, AgCl, $Ag_2SO_4$, $AgBF_4$ and/or AgOTf) and an amine compound (e.g., aqueous ammonia, methylamine, ethylamine, propylamine, butylamine, pentylamine, hexylamine, and/or ethylenediamine). For this biphasic method, the amine compound is chosen so that the amine solution is not miscible with the organic solution, thereby maintaining the two phases. Longer chain amine compounds (e.g., amines with three or more carbon atoms) are miscible with organic phases, and therefore are not used for the biphasic method (though these amines are used for the single-phase method described below). The addition of amines during the solution-phase growth reaction improved the size and quality of MOC crystals. The reaction mixture was heated and held at a temperature of about 25° C. to about 200° C. (e.g., about 25° C., 50° C., 100° C., 160° C., 170° C., 180° C., 190° C., or 200° C.) for about 0.5 hours to about 5 days (e.g., about 0.5 hours, about 1 hour, about 2 hours, about 3 hours, about 1 day, about 2 days, or about 5 days), and then cooled to room temperature. Resulting MOC microcrystals were then collected (e.g., by inserting a clean coverslip into a tilted biphasic solution and slowly removing the substrate). The collected microcrystals were washed with isopropanol and dried (e.g., by compressed nitrogen gas ($N_2$)).

As an example, for the biphasic hydrothermal synthesis of AgSePh, a bi-phasic mixture of diphenyl diselenide ($Ph_2Se_2$) in toluene and an aqueous solution of silver nitrate ($AgNO_3$) was heated at 180° C. for 1 hour to yield AgSePh crystals with average lateral size of ~2 μm. When amines were introduced into the reaction mixture, the size of the AgSePh crystals increased. By dissolving $AgNO_3$ in aqueous ammonia ($NH_3/H_2O$) instead of in pure water ($H_2O$), the hydrothermal reaction yielded microcrystals with larger sizes of ~20 μm. This size increase was not limited to $NH_3/H_2O$; larger microcrystals with sizes of ~30 μm and >200 μm were obtained when aqueous methylamine ($MeNH_2/H_2O$) or aqueous ethylamine ($EtNH_2/H_2O$) were used, respectively. In all cases, the resulting microcrystals exhibited blue luminescence at 467 nm, indicating that amines did not alter the product of the hydrothermal reaction.

FIG. 18C shows a schematic of a reaction vessel 1790 for synthesizing MOCs via an organic single-phase method. The single-phase method includes mixing together a silver compound, an organoselenium compound, an amine, and an organic solvent to form a miscible solution 1792 in a sealed reaction vessel 1790. This method uses longer-chain amines (e.g., propylamine, butylamine, pentylamine, or hexylamine), which are liquid at room temperature and soluble in organic solvents. Longer-chain amines have carbon chains with about 3 to about 20 carbon atoms. The miscible solution was kept at a temperature of about −30° C. to about 30° C. (e.g., −20° C., 4° C., 20° C., or 25° C.) for about 10 minutes to about 60 days (e.g., 20 minutes, 1 day, 2 days, 3 days, 4 days, 5 days, 6 days, 7 days, 8 days, 10 days, 14 days, 21 days, or 28 days).

As an example, AgSePh was prepared using this single-phase reaction method. The reaction was performed in a miscible solution of $AgNO_3$ and $Ph_2Se_2$ in a combined amine-toluene solution. For example, equal volumes of a 3 mM solution of $AgNO_3$ in propylamine ($PrNH_2$) and a 3 mM solution of $Ph_2Se_2$ in toluene were combined to form a 1.5 mM single-phase mixture with 50% v/v $PrNH_2$. After storage at room temperature for 3-5 days, this solution yielded millimeter-sized AgSePh crystals that were exfoliated to produce thin AgSePh flakes. These AgSePh flakes had photoluminescent emissions centered at 467 nm, consistent with AgSePh prepared via other methods. Similar results were obtained using amines with longer hydrocarbon chains, including butylamine, pentylamine, and hexylamine.

These three methods may be widely adapted to form different MOCs. These approaches were used to synthesize MOCs with different organic ligands by using different organoselenium compounds. For example, MOCs with different functional groups were synthesized by adding different functionalized organoselenium compounds in the reaction mixture. To form MOCs with other metals (e.g., gold or copper) instead of silver, the silver compound may be replaced with another metal compound (e.g., gold nitrate or copper nitrate). To synthesize MOCs with other chalcogens (e.g., sulfur or tellurium) instead of selenium, the organoselenium compound may be replaced with another organochalcogen compound (e.g., organosulfur compounds or organotellurium compounds).

The addition of amines to the reaction vessel and/or reaction mixture provided larger MOC crystals with higher crystalline quality. Amines in the reaction mixture may promote the formation of silver-amine complexes, which may slow crystal growth and thereby promote the formation of MOCs with fewer defects. Slower crystal growth facilitated by the presence of the amine may lead to an increase in PL lifetime by suppressing the formation of crystal defects, which can act as fast nonradiative recombination centers. Slower crystal growth in the presence of amines may be caused by reduced reaction activity of silver-amine complexes formed as reaction intermediates. To suppress the reaction rate further, other organic ligands such as phosphine, cyanide, or thiocyanide can be added to the reaction solution.

Detailed optical characterization by time-resolved and temperature-dependent photoluminescent spectroscopy showed that the addition of $NH_3$ in a biphasic hydrothermal synthesis led to MOCs with a two-fold increase in photoluminescent lifetime and a complete suppression of luminescent mid-gap states. Compared to MOCs synthesized without an amine in the reaction mixture, MOCs synthesized with an amine in the reaction mixture may have photoluminescent lifetimes that are twice as long. For example, AgSePh synthesized in the presence of $NH_3$ had a photoluminescent lifetime more than double that of AgSePh synthesized by conventional means, increasing from 93 picoseconds (ps) to 193 ps.

Without being bound by any particular theory, it is believed the amines may have two roles during synthesis: 1) as a coordinating ligand to reduce the reaction activity of $Ag^+$ ions, and 2) as a reactant to convert the organoselenium compound (e.g., $Ph_2Se_2$) into an active intermediate.

Figure 19A:
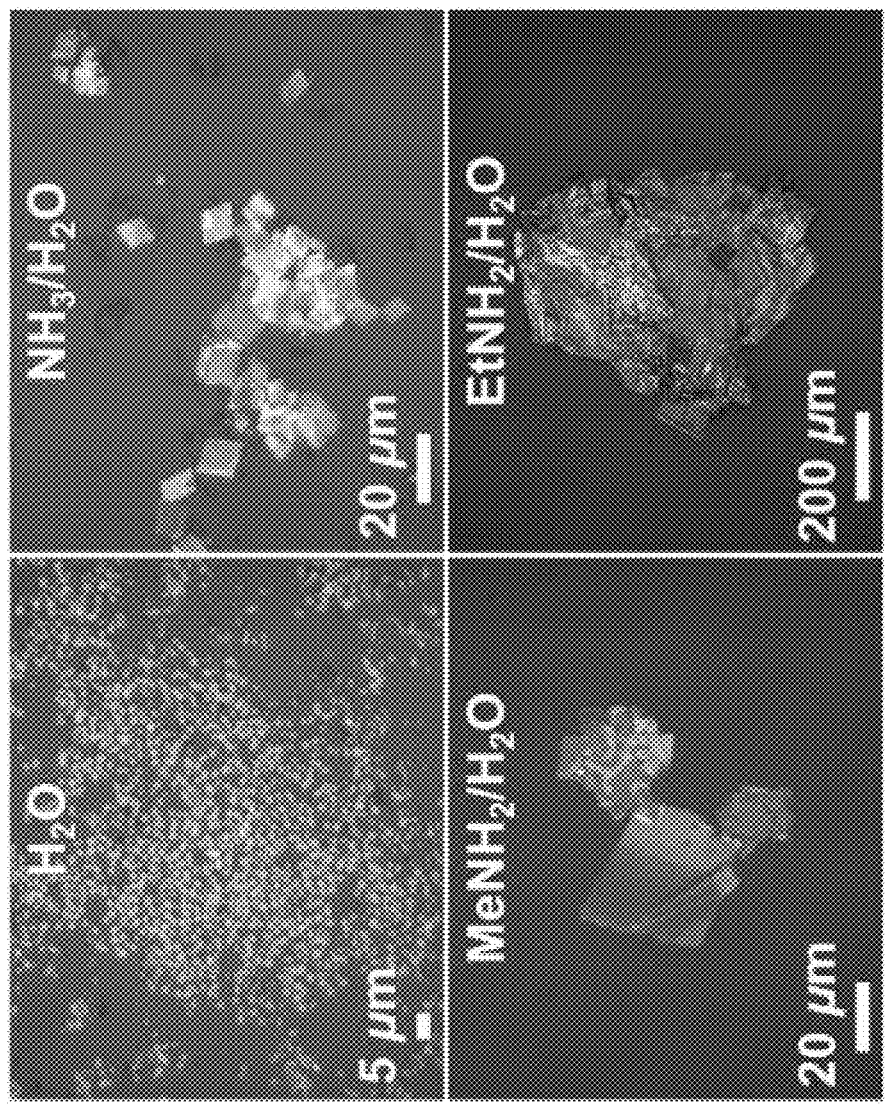
FIG. 19A shows bright-field optical micrographs of AgSePh prepared using a biphasic hydrothermal method.

FIG. 19A shows bright-field optical micrographs of AgSePh prepared using a biphasic hydrothermal method, with or without the addition of amines $NH_3$, $MeNH_2$, or $EtNH_2$. The size of the resulting AgSePh crystals increased with the addition of amines. AgSePh grown using $NH_3/H_2O$ had single crystal sizes of about 20 μm. Considering that previous methods produced single crystals of MOC that were less than 5 μm in size, this method represents a way to substantially increase the size of MOC single crystals. This size increase was not limited to $NH_3/H_2O$; larger microcrystals with sizes of ~30 μm and >200 μm were obtained when aqueous methylamine ($MeNH_2/H_2O$) and aqueous ethylamine ($EtNH_2/H_2O$) were used, respectively. In all cases, the resulting microcrystals exhibited blue luminescence at 467 nm, indicating that the addition of amines to the hydrothermal reaction did not alter the optoelectronic properties of the resulting AgSePh.

Figure 19B:
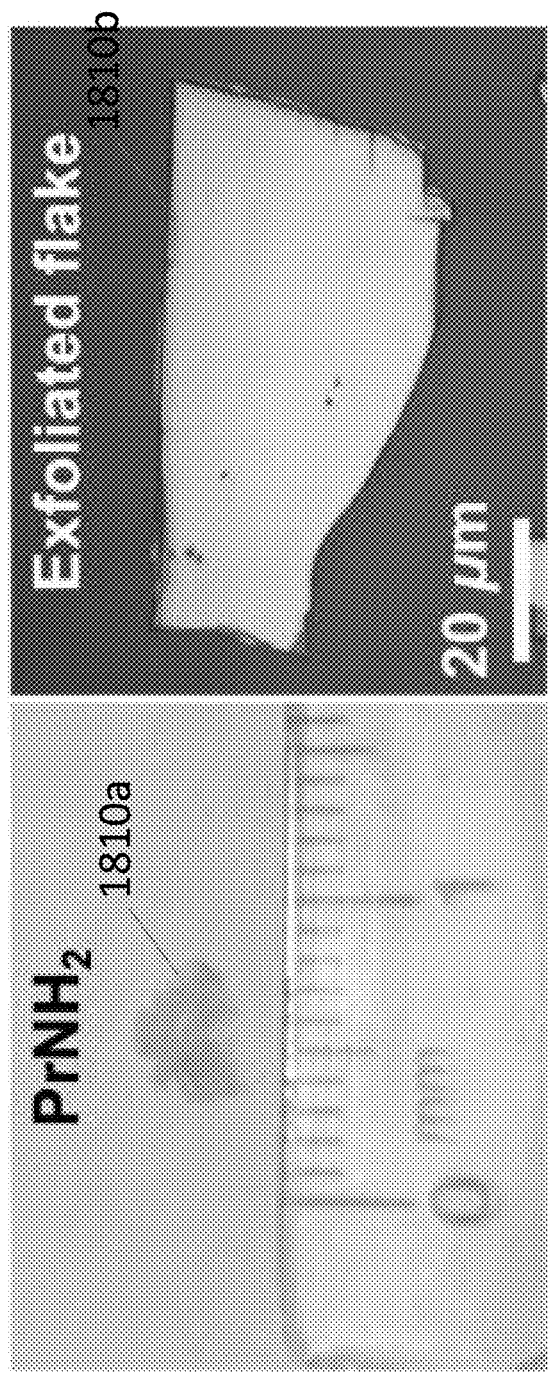
FIG. 19B shows images of AgSePh prepared using an organic single-phase method.

FIG. 19B shows images of an AgSePh crystal 1810a (left) synthesized via the organic single-phase method in the presence of $PrNH_2$ and an exfoliated AgSePh flake 1810b (right) from the crystal. During synthesis, equal volumes of a 3 mM solution of $AgNO_3$ in propylamine ($PrNH_2$) and a 3 mM solution of $Ph_2Se_2$ in toluene were combined to form a 1.5 mM single-phase mixture with 50% v/v $PrNH_2$. After storage at room temperature for about three to about five days, this solution yielded millimeter-sized crystals that were exfoliated to produce thin AgSePh flakes with photoluminescent emission centered at 467 nm, consistent with AgSePh grown via conventional methods.

Figure 20:
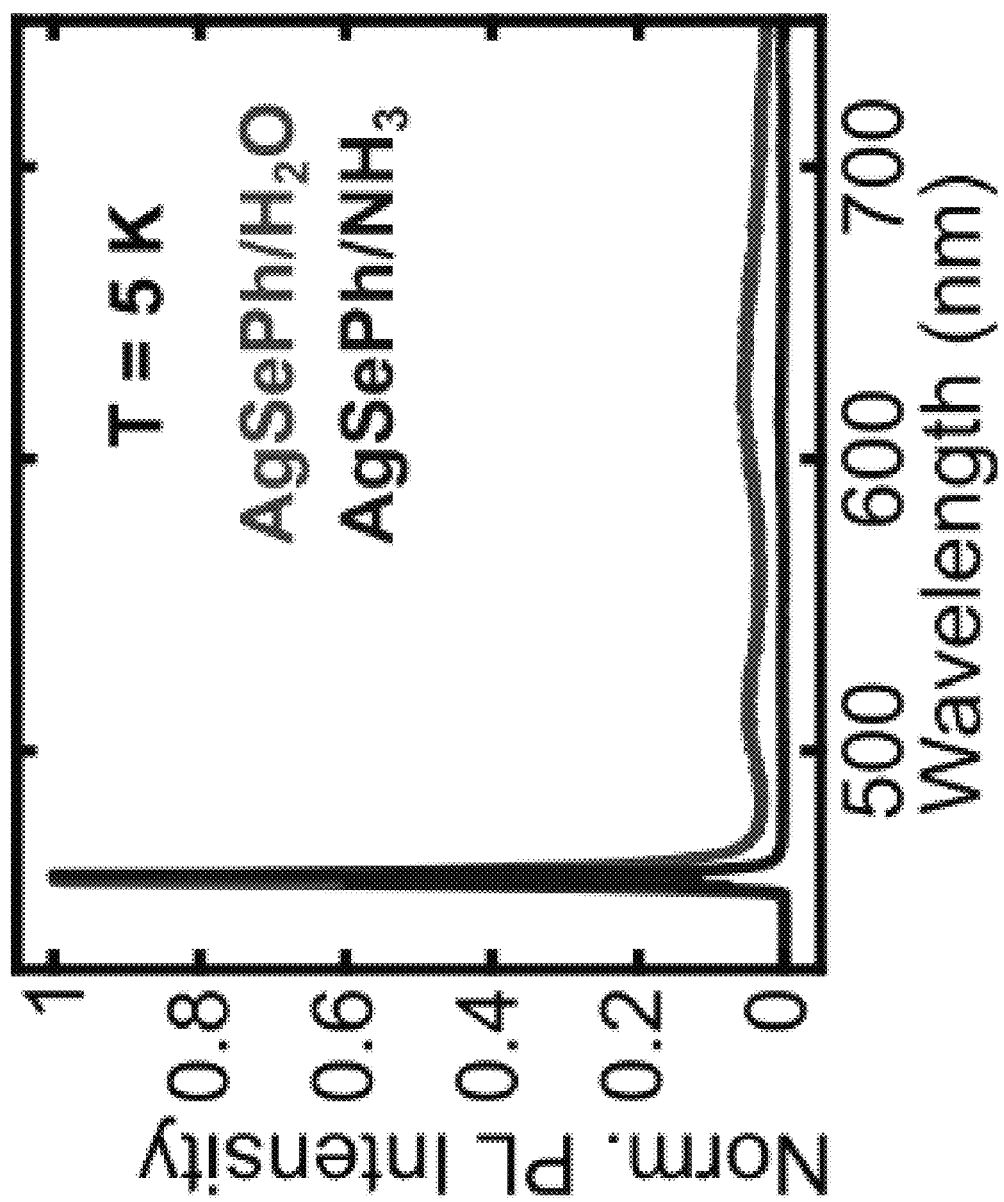
FIG. 20 shows photoluminescent spectra of AgSePh prepared using water ($H_2O$) alone or aqueous ammonia ($NH_3/H_2O$) at 5 K.

FIG. 20 compares the photoluminescent spectra of hydrothermally grown AgSePh crystals with and without $NH_3$ present during the reaction. Photoluminescent spectra were measured at 5 K. AgSePh was prepared using the biphasic hydrothermal method, with water ($H_2O$) alone or aqueous ammonia ($NH_3/H_2O$). At low sample temperature (below ~150 K), AgSePh crystals prepared in the absence of $NH_3$ showed broad low-energy photoluminescent features spanning 500-700 nm in addition to narrow excitonic emission at ~460 nm. In contrast, AgSePh crystals grown from $NH_3/H_2O$ showed only the narrow excitonic emission peak at 460 nm and substantially no emission at about 500 nm to about 700 nm. The spectrum of AgSePh prepared in aqueous ammonia showed fewer mid-gap state photoluminescence artifacts. Without being bound by any theory, this result suggests that amine-assisted synthesis may suppress the formation of mid-gap states in MOCs and may help explain the increased photoluminescent lifetime of MOCs grown using amine-assisted methods.

Fluorinated MOCs

As described above, the bandgap and emission spectrum of $[Ag(SeR)]_n$ may be changed by changing the R group. The R group may be a partially fluorinated hydrocarbon. R group fluorination may also determine the structural dimensions of the MOC (e.g., 0D, 1D, or 2D). The R group may include one or several fluorine atoms, where fluorine atoms are in positions typically occupied by hydrogens in the hydrocarbon structure. For example, introduction of F to two ortho positions on the benzene ring results in a 1D MOC. Without being bound by any theory, the structural dimensions of this MOC may be due to steric hindrance of the fluorine atoms.

Figure 21A:
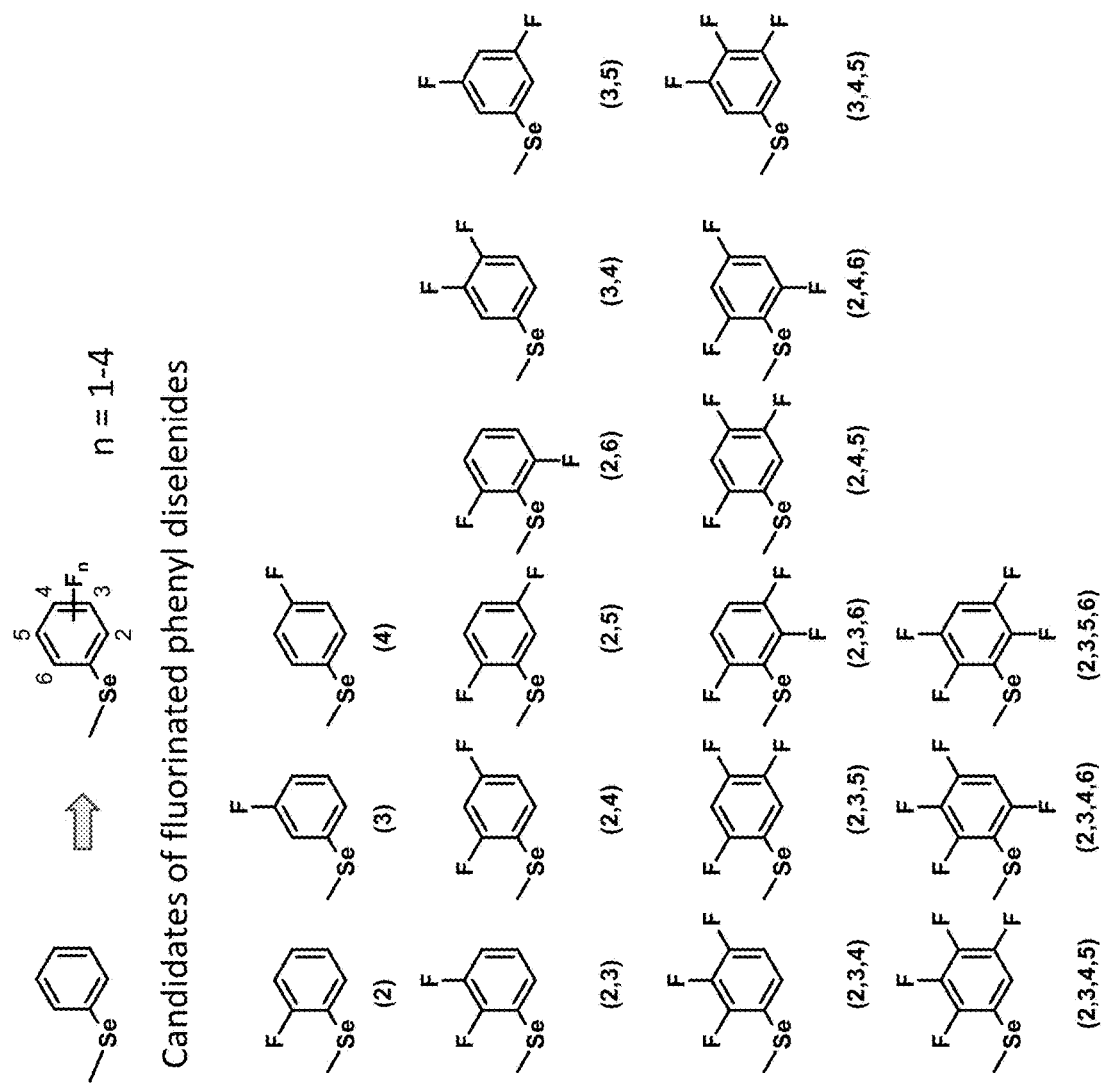
FIG. 21A shows candidates of fluorinated phenyl diselenides.

FIG. 21A shows a partial structure of several partially fluorinated phenyl diselenides that may be used as starting materials in the formation of partially fluorinated MOCs using the synthesis methods described above. The phenyl ring may be bonded to one, two, three, or four fluorine atoms at the 2, 3, 4, 5, and/or 6 position on the phenyl ring. The structural dimensions of the MOC may be determined, at least in part, by the position of the fluorine atoms. Without being bound by any theory, MOCs with fluorinated phenyl rings may have reduced nonradiative decay from the excited state as compared to MOCs with non-fluorinated phenyl rings because the MOCs with fluorinated phenyl rings may form more rigid chemical structures.

Figure 21B:
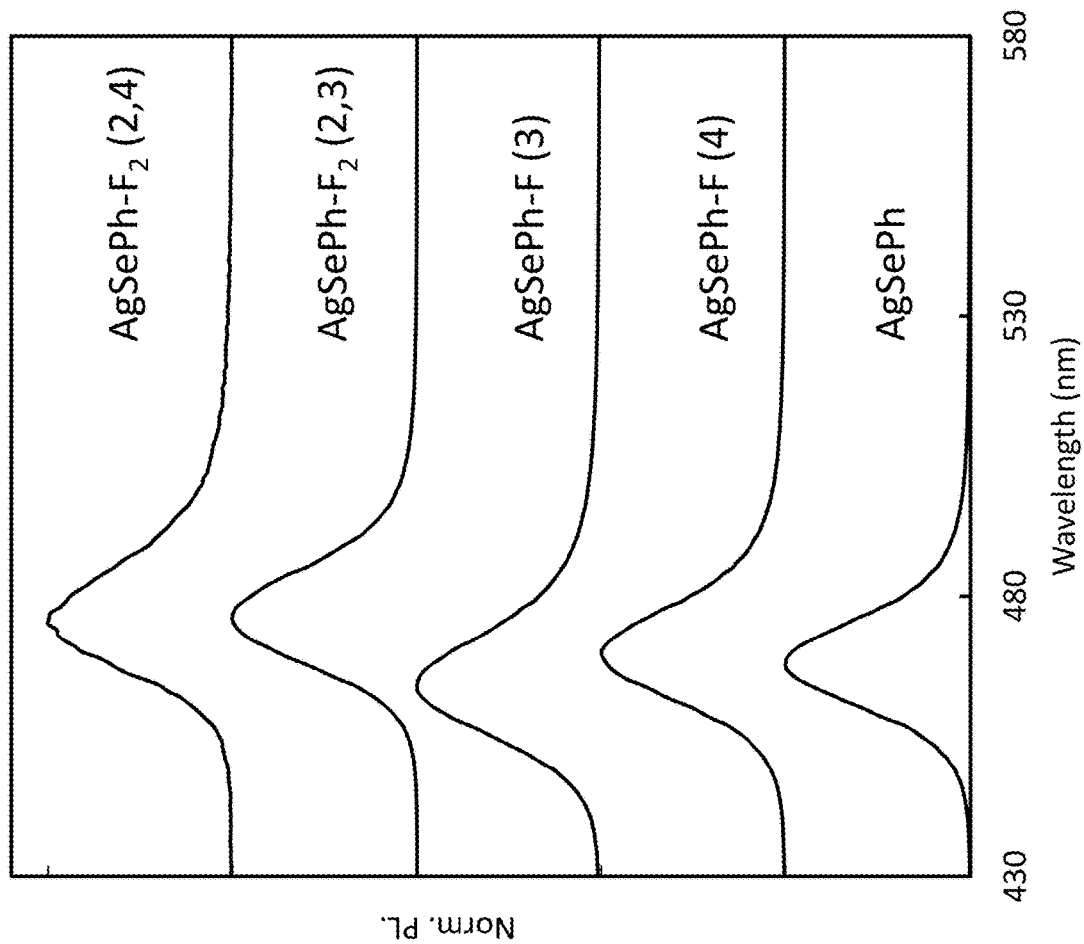
FIG. 21B shows photoluminescence spectra of fluorinated MOCs.

For example, the MOC may be $AgSePh-F_2$ (2,3), $AgSePh-F_2$ (2,4), $AgSePh-F_2$ (2,5), $AgSePh-F_2$ (2,6), $AgSePh-F_2$ (3,4), $AgSePh-F_2$ (3,5), $AgSePh-F_3$ (2,3,4), $AgSePh-F_3$ (2,3,5), $AgSePh-F_3$ (2,3,6), $AgSePh-F_3$ (2,4,6), $AgSePh-F_3$ (2,4,5), $AgSePh-F_3$ (3,4,5), $AgSePh-F_3$ (2,3,5), $AgSePh-F_4$ (3,4,5,6), $AgSePh-F_4$ (2,4,5,6), or $AgSePh-F_4$ (2,3,5,6). FIG. 21B shows absorption spectra (left) and photoluminescence spectra (right) of several MOCs. Spectra are shown for AgSePh, AgSePh-F (4), AgSePh-F (3), $AgSePh-F_2$ (2,3), and $AgSePh-F_2$ (2,4). These MOCs form 2D structures. Compared to non-fluorinated AgSePh, fluorinated versions have shifted absorption and emission peaks. AgSePh-F (4), $AgSePh-F_2$ (2,3), and $AgSePh-F_2$ (2,4) have emission peaks that are shifted to longer wavelengths as compared to AgSePh. AgSePh-F (4) has an emission peak at 475 nm±3 nm, $AgSePh-F_2$ (2,3) has an emission peak at 480 nm±3 nm, and $AgSePh-F_2$ (2,4) has an emission peak at 479 nm±3 nm. AgSePh-F (3) has an emission peak at 464 nm±3 nm that is shifted to a shorter wavelength as compared to AgSePh.

Figure 21C:
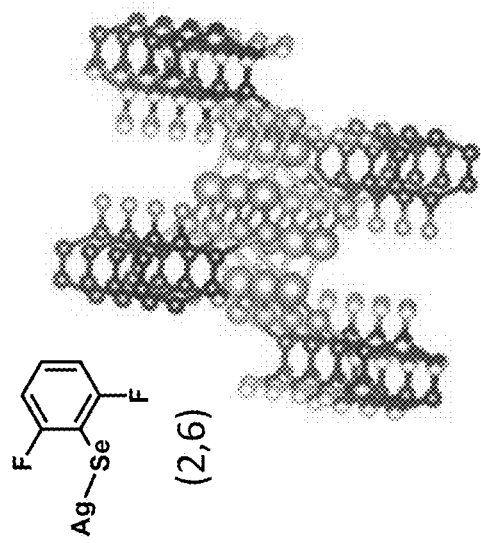
FIG. 21C shows the structure of $AgSePhF_2$-(2,6).
Figure 21D:
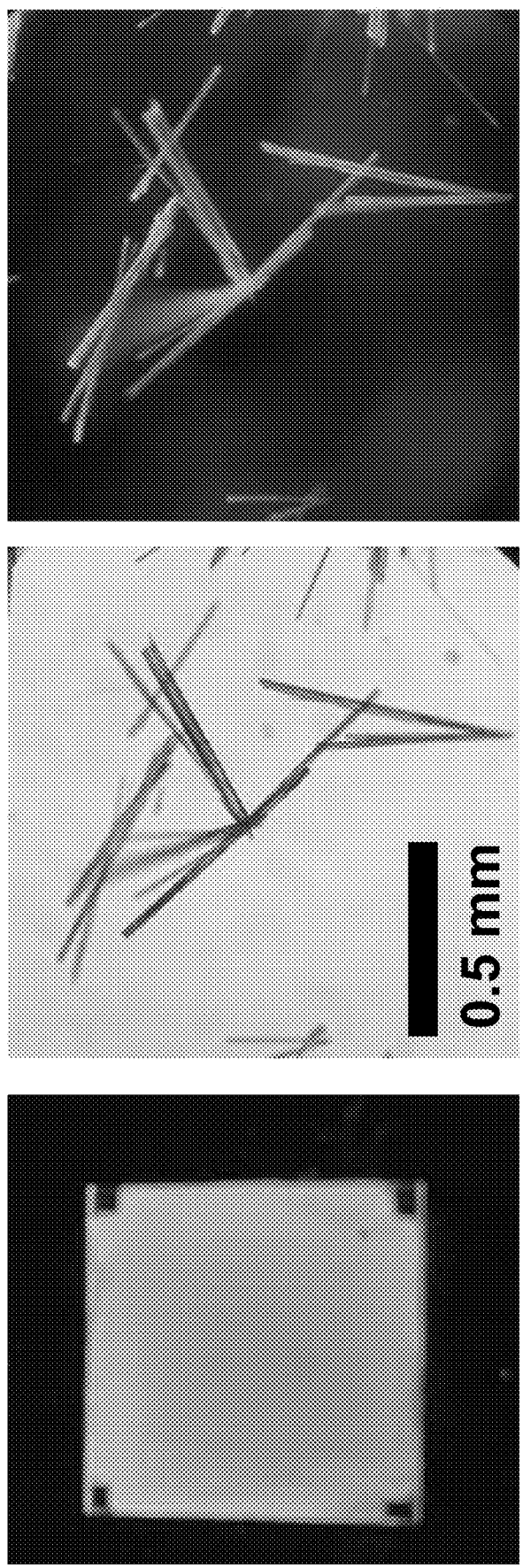
FIG. 21D shows optical images of $AgSePhF_2$-(2,6).
Figure 21E:
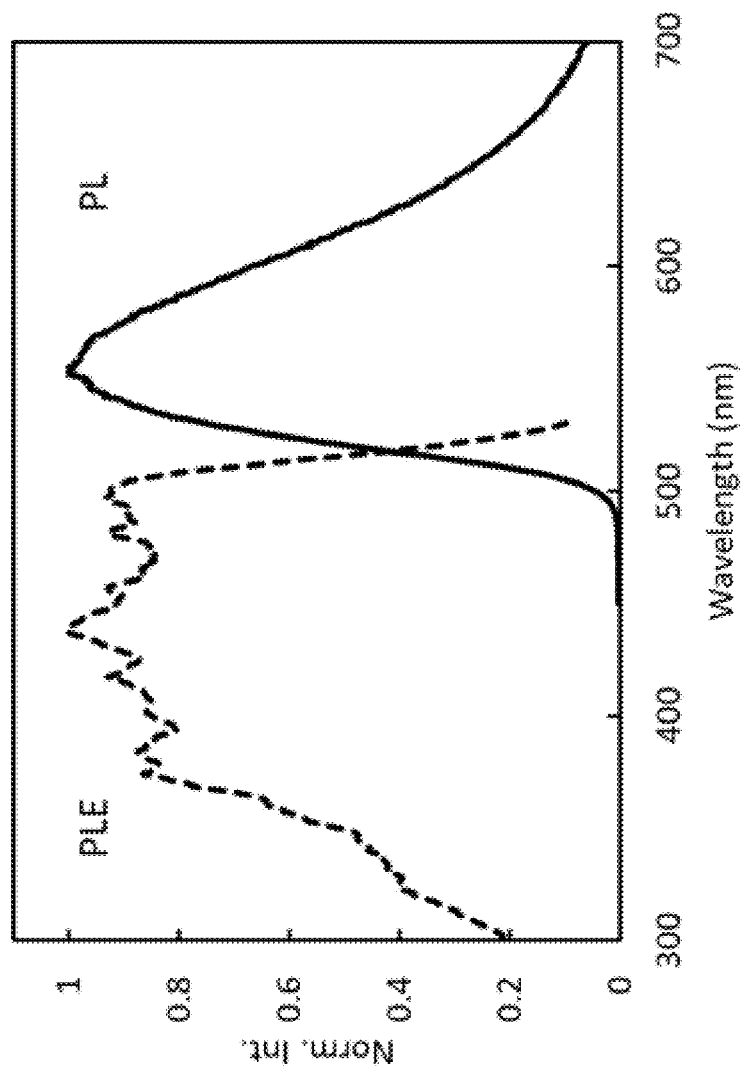
FIG. 21E shows the photoluminescence excitation (PLE) spectrum and photoluminescence spectrum of $AgSePhF_2$-(2,6).

FIG. 21C shows the crystal structure of $AgSePh-F_2$ (2,6), which forms a 1D crystal structure. FIG. 21D show optical pictures of the photoluminescence of $AgSePh-F_2$ (2,6) under UV light. $AgSePh-F_2$ (2,6) can be formed as a thin film, as shown in FIG. 21D (left), or as 1D crystals, as shown in FIG. 21D (right). FIG. 21E shows PLE and PL spectra of $AgSePh-F_2$ (2,6), which has an emission peak at about 560 nm.

Applications of MOCs

MOCs can be used in several optoelectronic devices, including light emitting diodes, photodetectors, and photovoltaic cells. MOC crystal quality, morphology and size affect electrical and optoelectronic device properties because they determine the effective current path length and the charge transport efficiency. All other properties being equal, MOC films with larger, higher quality crystals show higher conductivity and photoconductivity because they have fewer grain boundaries. Therefore, the MOCs described herein are well-suited to device integration.

Figure 22A:
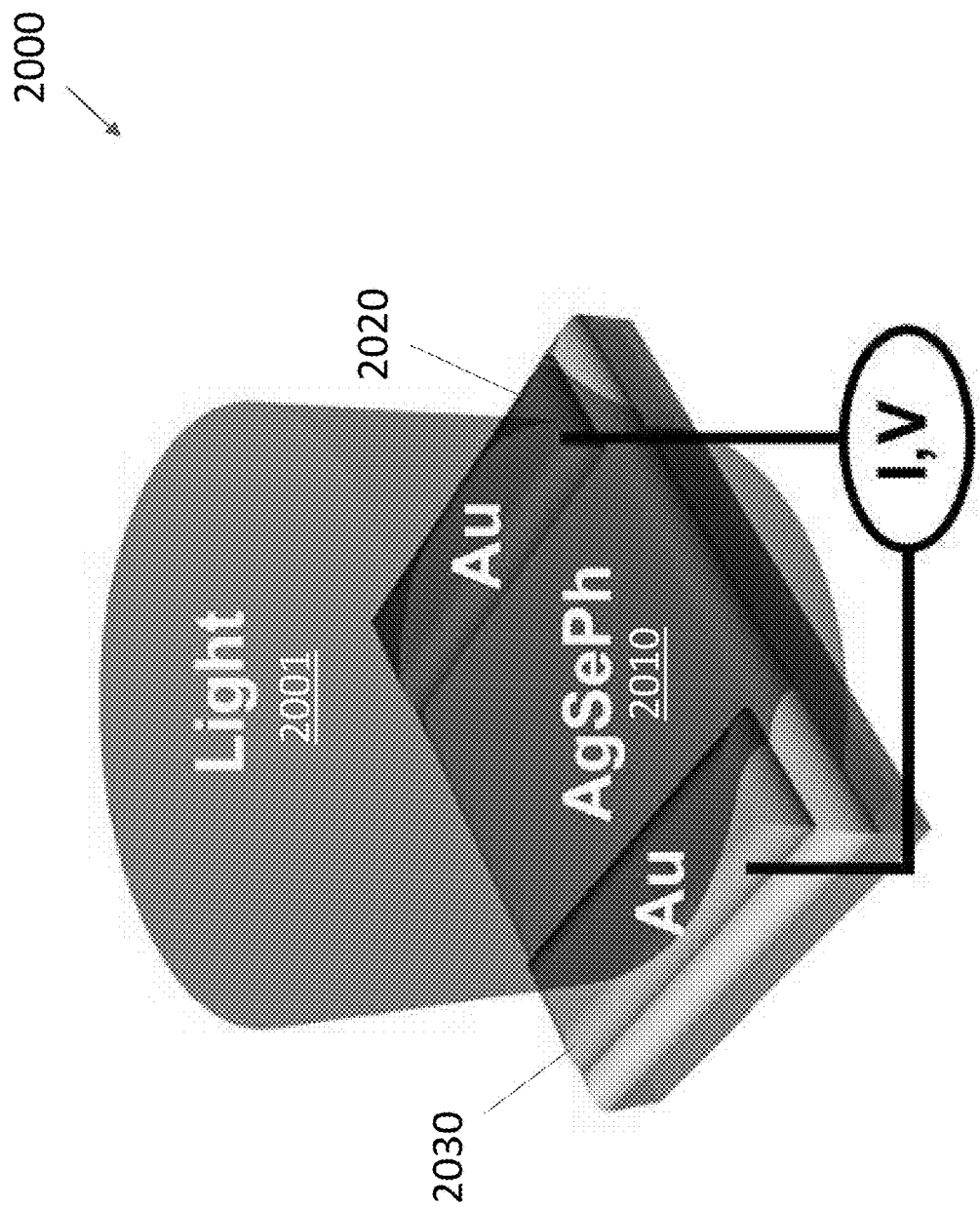
FIG. 22A shows a schematic of an AgSePh photodetector.

FIG. 22A shows a schematic of a lateral photodetector 2000 using a AgSePh thin film 2010 as the photoabsorber. Two gold (Au) electrodes 2020 and 2030 are disposed (e.g., deposited) on a portion of the surface of the AgSePh film 2010 and facilitate the measurement of current across the AgSePh film 2010 under dark and light conditions. When illuminated by UV light 2001, the photodetector 2000 generates an electrical current across the electrodes 2020 and 2030.

Figure 22B:
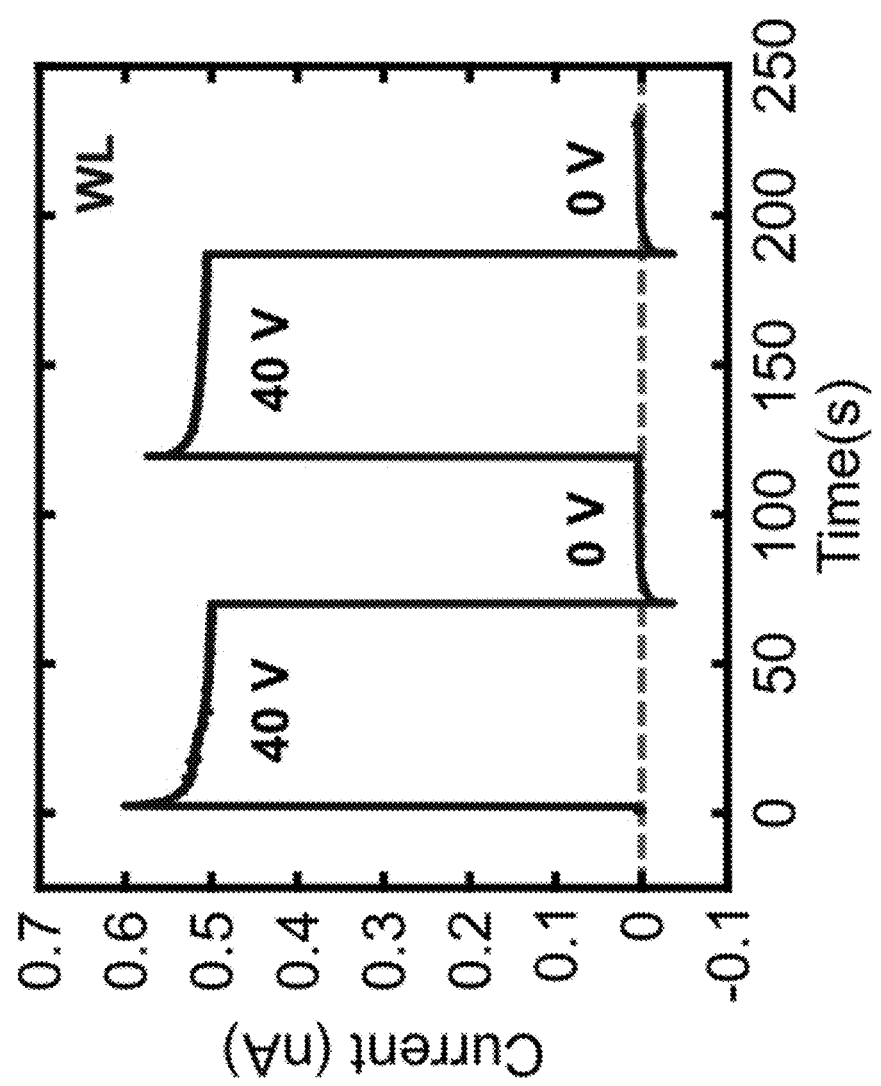
FIG. 22B shows the performance of the AgSePh photodetector in FIG. 22A under white light cycling.

FIG. 22B shows current measurements across an AgSePh film 2010 during white light on/off cycling. The AgSePh film 2010 was prepared using the vapor-phase method in the presence of $PrNH_2$. The AgSePh film 2010 had very low conductivity under the dark condition, below the instrument limit of $3.7 \times 10^{-9}$ S/m. Upon white light illumination, the AgSePh film 2010 had a photoconductivity of $1.7 \times 10^{-6}$ S/m with stable and reproducible on/off behavior. The low conductivity under dark conditions suggests that the AgSePh film 2010 had a low density of defects arising from Ag and Se vacancies and/or interstitials that act as free charge carriers. The high photoconductivity and non-measurable dark conductivity suggest that the AgSePh film 2010 had high crystalline quality and low defect density.

Figure 23:
FIG. 23 is a cross-sectional schematic of a light emitting diode (LED)

FIG. 23 shows a cross-sectional schematic of a light emitting diode (LED) 2300. The LED includes an anode 2310, a hole-injection layer (HIL) 2320 coupled to the anode 2310, a hole-transport layer (HTL) 2330 coupled to the HIL, an emissive layer 2340 coupled to the HIL, an electron-transport layer (ETL) 2350 coupled to the emissive layer 2340, an electron-injection layer (EIL) 2360 coupled to the ETL, and a cathode 2370 coupled to the EIL. The cathode 2370 may be disposed on a substrate 2380. One or more MOCs may be used as the emissive layer 2340 in the LED. As the emissive layer 2340, the MOC receives electrons and holes from the anode and the cathode through the HIL, HTL, ETL, and EIL. When electrons and holes combine in the MOC emissive layer 2340, light is generated. MOC emissive layer may be deposited directly on the ETL or HTL via the vapor-phase chemical transformation method described above. Alternatively, the MOC emissive layer may be formed from microcrystals prepared by the solution-phase methods described above.

Figure 24:
FIG. 24 is a cross-sectional schematic of a solar cell.

FIG. 24 shows a cross-sectional schematic of a solar cell 2400. The solar cell includes a cathode 2410, an ETL 2420 coupled to the cathode, a light absorbing layer 2430 coupled to the ETL 2420, a HTL 2440 coupled to the light absorbing layer 2430, and an anode 2450 coupled to the HTL 2440. The anode 2450 may be disposed on a substrate 2460. The light absorbing layer 2430 may include one or more MOC. When light is absorbed by the MOC light absorbing layer 2430, electrons and holes are generated and extracted through the electrodes to generate electricity. The MOC light-absorbing layer may be deposited using the vapor-phase chemical transformation method described above. Alternatively, the MOC light-absorbing layer may be formed from microcrystals prepared by the solution-phase methods described above.

Figure 25:
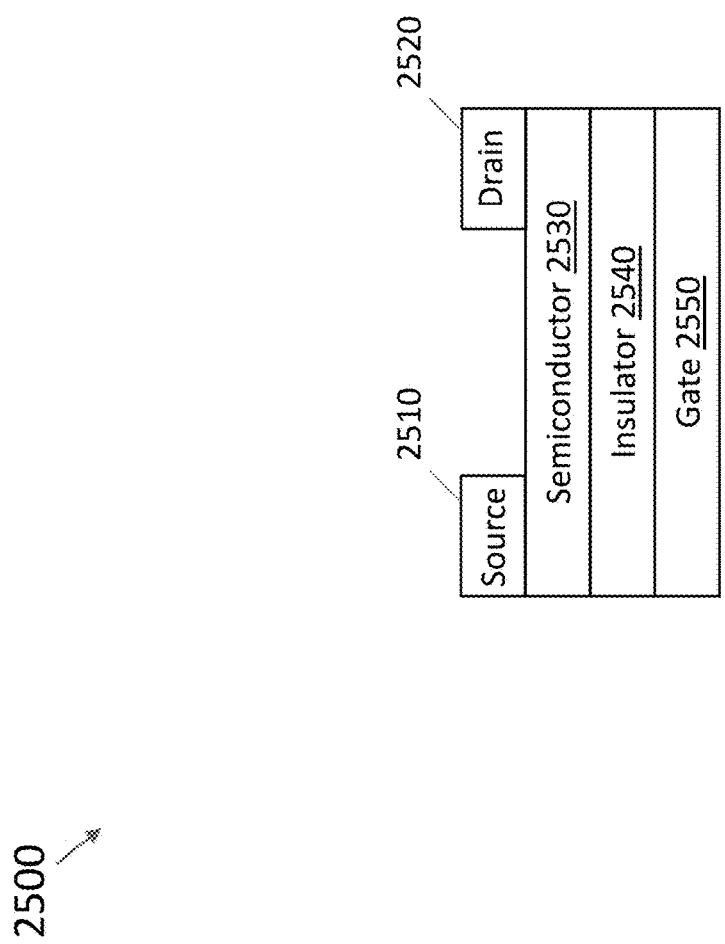
FIG. 25 is a cross-sectional schematic of a transistor, chemical sensor, or photodetector.

FIG. 25 shows a cross-sectional schematic of a transistor 2500. The transistor 2500 includes a source 2510 and a drain 2520 coupled to one side of a semiconductor 2530. The other side of the semiconductor 2530 is coupled to one side of an insulator 2540. Another side of the insulator 2540 is coupled to a gate 2550. The semiconductor 2530 includes one or more MOCs. The electrical properties of the MOC semiconductor 2530 are influenced by electrical gating. The structure of the transistor 2500 may also be used as a chemical sensor or a photodetector. As a chemical sensor, electrical properties of the MOC semiconductor 2530 are influenced by the presence of chemicals in the gas or liquid state (e.g., $O_2$, $H_2S$, CO, $CO_2$, $N_2O$, $NO_2$, $NH_3$, $HCl_{(aq)}$, $HNO_{3(aq)}$, $NH_{3(aq)}$, glucose, proteins, and amino acids). The MOC semiconductor may be deposited using the vapor-phase chemical transformation method described above. Alternatively, the MOC semiconductor may be formed from microcrystals prepared by the solution-phase methods described above.

Figure 26:
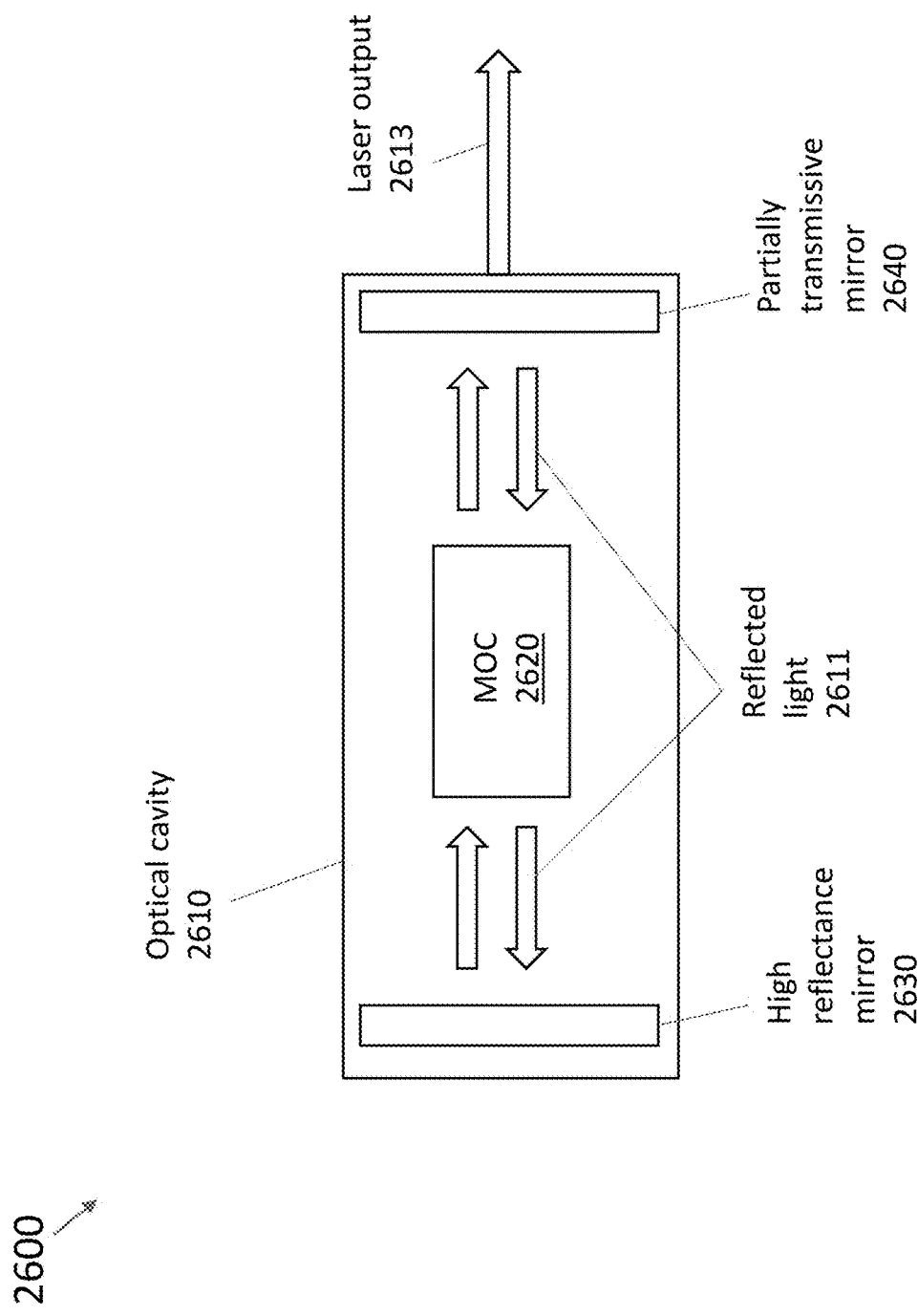
FIG. 26 is a cross-sectional schematic of a laser.

FIG. 26 shows a cross-sectional image of a laser 2600. The laser 2600 includes an optical cavity 2620. An MOC element 2620 is disposed inside of the optical cavity 2610. A high reflectance mirror 2630 is disposed inside of the optical cavity 2610 toward one end of the optical cavity 2610. A partially transmissive mirror 2640 is disposed inside of the optical cavity 2610 toward the opposite end of the optical cavity 2610. The partially transmissive mirror 2640 is optically aligned with the high reflectance mirror 2630. The MOC element 2620 is a lasing material that emits light into the optical cavity 2610 when an electric potential is applied to it. The emitted light is reflected by the high reflectance mirror 2630 and the partially transmissive mirror 2640. Reflected light 2611 is amplified as it is reflected back and forth between the two mirrors. Some of the reflected light 2611 is transmitted through the partially transmissive mirror 2640, forming laser output 2613. The MOC element may be deposited in the optical cavity 2610 using the vapor-phase chemical transformation method described above. Alternatively, the MOC element may be formed from microcrystals prepared by the solution-phase methods described above.

MOCs may also be used in other applications. These applications include bio-imaging, catalysis, and synthesis of nanomaterials. In bio-imaging, MOC's luminescent properties may be used as biomarkers to label cells, proteins, nucleic acids, lipids, and organic molecules for imaging purposes. For catalysis, MOCs may act as catalysts, photocatalysts, or electrocatalysts to accelerate chemical reactions (e.g., hydrogen evolution reaction, water splitting, and carbon capture). For nanomaterial synthesis, MOCs may act as starting materials for making metal chalcogenides (e.g., $Ag_2Se$). Heat may be used to decompose the organic components of MOCs, thereby forming metal chalcogenides.

EXAMPLES

Figure 27:
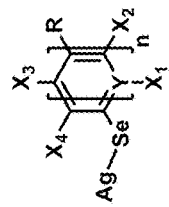
FIG. 27 is a table showing properties of several MOCs.

FIG. 27 is a table of MOCs with aryl R groups that were investigated. The table includes MOCs with several different types of functional groups, as descried above, and with different numbers of aromatic rings. Remarkably, unlike conventional forms of MOCs, all of these MOCs are photoluminescent. MOCs were synthesized with the vapor-phase tarnishing method and/or the single-phase solution method described above. Many of the MOCs investigated had a 2D structure, but AgSePy (Example 9) AgSePh-$F_2$ (1,2) (Example 14) had a 1D structure.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of" "only one of," or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A metal organic chalcogenolate comprising:
   silver phenylselenolate comprising a phenyl portion functionalized with at least one functional group;
   wherein the at least one functional group is selected from the group consisting of:
      methyl ($CH_3$),
      dimethylamine ($N(CH_3)_2$),
      thiomethyl ($SCH_3$),
      fluoro (F), trifluoromethyl ($CF_3$),
      carboxy (COOH),
      cyanide (CN),
      nitro ($NO_2$), and
      alkoxy ($OC_xH_y$) having a linear configuration or a branched configuration,
   where x is about 2 to about 30;
   the metal organic chalcogenolate comprises a single crystal having at least one side with a dimension of about 5 μm to about 5 mm; and
   a selenium ion of the silver phenylselenolate is bonded only to a single functional group.

2. The metal organic chalcogenolate of claim 1, wherein the single crystal consists essentially of a single monolayer or up to about ten layers.

3. The metal organic chalcogenolate of claim 1, wherein when illuminated by a light having a wavelength of about 400 nm to about 410 nm, the metal organic chalcogenolate emits substantially no light at about 500 nm to about 700 nm.

4. A photodetector comprising the metal organic chalcogenolate of claim 1.

5. A light-emitting diode comprising an emissive layer comprising the metal organic chalcogenolate of claim 1.

* * * * *